(12) United States Patent
Lee et al.

(10) Patent No.: US 12,341,139 B2
(45) Date of Patent: Jun. 24, 2025

(54) DISPLAY DEVICE AND METHOD OF FABRICATING THE SAME

(71) Applicant: Samsung Display Co., Ltd., Yongin-si (KR)

(72) Inventors: Ki Yeup Lee, Yongin-si (KR); Dong Hyeon Ki, Anyang-si (KR); Dong Hee Shin, Anyang-si (KR); Dong Yoon Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 17/454,026

(22) Filed: Nov. 8, 2021

(65) Prior Publication Data

US 2022/0254813 A1    Aug. 11, 2022

(30) Foreign Application Priority Data

Feb. 9, 2021   (KR) .......................... 10-2021-0017996

(51) Int. Cl.
| | |
|---|---|
| *H01L 25/16* | (2023.01) |
| *H01L 23/00* | (2006.01) |
| *H10D 86/01* | (2025.01) |
| *H10D 86/40* | (2025.01) |
| *H10D 86/60* | (2025.01) |
| *H10D 89/60* | (2025.01) |
| *H10K 59/80* | (2023.01) |

(52) U.S. Cl.
CPC ............ *H01L 25/167* (2013.01); *H01L 24/95* (2013.01); *H10D 86/021* (2025.01); *H10D 86/441* (2025.01); *H10D 86/481* (2025.01); *H10D 86/60* (2025.01); *H10D 89/60* (2025.01); *H10K 59/805* (2023.02); *H01L 24/24* (2013.01); *H01L 2224/24147* (2013.01); *H01L 2224/95101* (2013.01); *H01L 2224/95145* (2013.01)

(58) Field of Classification Search
CPC ..... H01L 27/124; H01L 24/95; H01L 25/167; H01L 27/0248; H01L 27/1255; H01L 27/1259
USPC .......................................................... 257/71
See application file for complete search history.

(56) References Cited

U.S. PATENT DOCUMENTS

| | | | | |
|---|---|---|---|---|
| 9,472,948 | B2 * | 10/2016 | Petruzzi | H01L 27/0248 |
| 9,865,621 | B2 * | 1/2018 | Nakatani | G09G 3/3655 |
| 10,424,569 | B2 * | 9/2019 | Lu | H01L 33/36 |
| 2018/0019369 | A1 * | 1/2018 | Cho | H01L 33/38 |

FOREIGN PATENT DOCUMENTS

| | | |
|---|---|---|
| KR | 10-0495901 B1 | 6/2005 |
| KR | 10-0583162 B1 | 5/2006 |

\* cited by examiner

*Primary Examiner* — Ori Nadav
(74) *Attorney, Agent, or Firm* — Womble Bond Dickinson (US) LLP

(57) ABSTRACT

A display device includes a first substrate, a first electrode on the first substrate, a second electrode on the first substrate and spaced from the first electrode, a plurality of light-emitting elements each having respective end portions on the first and second electrodes, a first transistor having a first end connected to the first electrode and a second end grounded, and a second transistor having a first end connected to the second electrode and a second end grounded, wherein the first transistor is forward-biased to the first electrode, and the second transistor is reverse-biased to the second electrode.

13 Claims, 23 Drawing Sheets

DISPLAY DEVICE AND METHOD OF FABRICATING THE SAME

CROSS-REFERENCE TO RELATED APPLICATION

This application claims priority to and the benefit of Korean Patent Application No. 10-2021-0017996 filed on Feb. 9, 2021 in the Korean Intellectual Property Office, the entire content of which is incorporated by reference herein.

BACKGROUND

1. Field

The present disclosure relates to a display device and a method of fabricating the same.

2. Description of the Related Art

Display devices are becoming more important with developments in multimedia technology. Accordingly, various display devices such as an organic light-emitting diode (OLED) display device, a liquid crystal display (LCD) device, and the like have been used.

A typical display device includes a display panel for displaying an image, such as an OLED display panel or an LCD panel. A light-emitting display panel may include light-emitting elements such as light-emitting diodes (LEDs). The LEDs, for example, are classified into organic LEDs (OLEDs) using an organic light-emitting material and an inorganic LEDs (ILEDs) using an inorganic light-emitting material.

SUMMARY

One or more embodiments of the present disclosure provide a display device, which includes a virtual circuit for preventing or reducing the generation of static electricity on electrodes and is capable of stably improving the alignment of light-emitting elements, and a method of fabricating the display device.

However, aspects and features of the embodiments of the present disclosure are not limited to those set forth herein. The above and other aspects and features of the embodiments of the present disclosure will become more apparent to one of ordinary skill in the art to which the present disclosure pertains by referencing the detailed description of the present disclosure given below.

According to the aforementioned and other embodiments of the present disclosure, as a display device includes a circuit (or a virtual circuit) connected to electrodes, static electricity generated due to the surface friction between ink and the electrodes can be removed. Also, an electrostatic current may flow in the circuit (or the virtual circuit) due to the static electricity, light-emitting elements can be preliminarily aligned by an electric field generated by the electrostatic current. The light-emitting elements may be prevented from being damaged by the static electricity, and the degree of alignment of the light-emitting elements may be improved due to the preliminary alignment of the light-emitting elements by the electrostatic current.

It should be noted that the aspects and features of embodiments of the present disclosure are not limited to those described above, and other aspects and features of embodiments of the present disclosure will be apparent from the following description.

According to an embodiment of the present disclosure, a display device includes a first substrate, a first electrode on the first substrate, a second electrode on the first substrate and spaced from the first electrode, a plurality of light-emitting elements each having respective end portions on the first and second electrodes, a first transistor having a first end connected to the first electrode and a second end grounded, and a second transistor having a first end connected to the second electrode and a second end grounded, wherein the first transistor is forward-biased to the first electrode, and the second transistor is reverse-biased to the second electrode.

The display device may further include a first voltage line and a second voltage line between the first substrate and the first electrode and the second electrode, wherein the first voltage line may be electrically connected to the first electrode, and the second voltage line is electrically connected to the second electrode.

The display device may further include a first capacitor connected to a node between the first electrode and the first end of the first transistor, and a second capacitor connected to a node between the second electrode and the first end of the second transistor.

The display device may further include a third transistor connected to a node between the first voltage line and the first electrode, a third capacitor connected between the third transistor and the first electrode, a fourth transistor connected to a node between the second voltage line and the second electrode, and a fourth capacitor connected between the fourth transistor and the second electrode, wherein different voltages may be applied to the first and second voltage lines, and at least one of the third and fourth transistors may be forward-biased.

The display device may further include a third transistor connected to a node between the first voltage line and the first electrode, a third capacitor connected between the third transistor and the first electrode, a fourth transistor connected to a node between the second voltage line and the second electrode, and a fourth capacitor connected between the fourth transistor and the second electrode, wherein a same voltage may be applied to the first and second voltage lines, and at least one of the third and fourth transistors may be forward-biased.

The first transistor may include a first drain electrode electrically coupled to the first electrode, a first source electrode grounded, and a first gate electrode electrically coupled to the first drain electrode, and the second transistor may include a second drain electrode electrically coupled to the second electrode, a second source electrode grounded, and a second gate electrode electrically coupled to the second source electrode.

The first transistor may include a first source electrode electrically coupled to the first electrode, a first drain electrode grounded, and a first gate electrode electrically coupled to the first drain electrode, and the second transistor may include a second source electrode electrically coupled to the second electrode, a second drain electrode grounded, and a second gate electrode electrically coupled to the second source electrode.

Each of the light-emitting elements may include a first semiconductor layer, a second semiconductor layer, and a light-emitting layer between the first semiconductor layer and the second semiconductor layer, first end portions of the light-emitting elements on the first electrode, where the first semiconductor layer is at the first end portion of a respective one of the light-emitting elements, and second end portions of the light-emitting elements on the second electrode, where the second semiconductor layer is at the second end portion of a respective one of the light-emitting elements.

The display device may further include a driving transistor connected to the first voltage line and the second voltage line, wherein the first electrode may be connected to the driving transistor, and the second electrode may be directly connected to the second voltage line.

The display device may further include a via layer between the first substrate and the first electrode and the second electrode, wherein the first transistor, the second transistor, and the driving transistor may be between the via layer and the first substrate.

The display device may further include a first conductive layer on the first substrate, a buffer layer on the first conductive layer, an active layer on the buffer layer, a first gate insulating layer on the active layer, a second conductive layer on the first gate insulating layer, a first interlayer insulating layer on the second conductive layer, and a third conductive layer on the first interlayer insulating layer, wherein source electrodes and drain electrodes of the first transistor, the second transistor, and the driving transistor may be formed of the third conductive layer.

The first voltage line and the second voltage line may be formed of the third conductive layer, the first electrode may be directly connected to the source electrode of the driving transistor through a contact hole that penetrates the via layer, and the second electrode may be directly connected to the second voltage line through a contact hole that penetrates the via layer.

The display device may further include a first connecting electrode on, and in contact with, the first electrode and first end portions of the light-emitting elements, and a second connecting electrode on, and in contact with, the second electrode and the second end portions of the light-emitting elements.

The display device may further include a first insulating layer covering the first electrode and the second electrode, and a second insulating layer around portions of outer surfaces of each of the light-emitting elements, wherein at least a portion of the first connecting electrode and a portion of the second connecting electrode may be on the second insulating layer.

According to an embodiment of the present disclosure, a method of fabricating a display device, includes forming a first transistor, a first electrode that is electrically connected to a first voltage line, a second transistor, and a second electrode that is electrically connected to a second voltage line, on a first substrate, spraying ink having light-emitting elements dispersed therein onto the first and second electrodes, preliminarily aligning the light-emitting elements on the first and second electrodes by generating a first electric field with static electricity that flows in the first transistor and another static electricity that flows in the second electrode and the second transistor, and secondarily aligning the light-emitting elements by applying alignment voltages to the first and second electrodes to generate a second electric field on the first and second electrodes.

The first transistor may be forward-biased to the first electrode, and the second transistor may be reverse-biased to the second electrode.

The first transistor may have a first drain electrode connected to the first electrode, a first source electrode grounded, and a first gate electrode connected to the first drain electrode, and the second transistor may have a second drain electrode connected to the second electrode, a second source electrode grounded, and a second gate electrode connected to the second source electrode.

In the preliminarily aligning the light-emitting elements, a first electrostatic current is to flow to the first transistor from the first electrode, a second electrostatic current is to flow from the second transistor to the second voltage line via the second electrode, and the light-emitting elements may be aligned by the first electric field, such that both end portions of each of the light-emitting elements are on the first and second electrodes.

In the secondarily aligning the light-emitting elements, alternating current (AC) power may be applied to the first voltage line, and the second voltage line is grounded.

In the secondarily aligning the light-emitting elements, the second electric field may be generated between the first and second electrodes, and the light-emitting elements may be aligned such that first end portions and second end portions of the light-emitting elements are on the first and second electrodes, respectively.

The secondarily aligning the light-emitting elements, may include applying light to the light-emitting elements, and the alignment voltages may be applied to the first and second electrodes with the light applied to the light-emitting elements.

Each of the light-emitting elements may include a first semiconductor layer, a second semiconductor layer, and a light-emitting layer between the first and second semiconductor layers, first end portions of the light-emitting elements are on the first electrode, where the first semiconductor layer of a respective one of the light-emitting elements is at the first end portion of the light-emitting element, and second end portions of the light-emitting elements are on the second electrode, and where second semiconductor layer of a respective one of the light-emitting elements is at the second end portion of the light-emitting element.

BRIEF DESCRIPTION OF THE DRAWINGS

The above and other aspects and features of the embodiments of the present disclosure will become more apparent by describing in detail embodiments thereof with reference to the attached drawings, in which.

DETAILED DESCRIPTION

Figure 1:
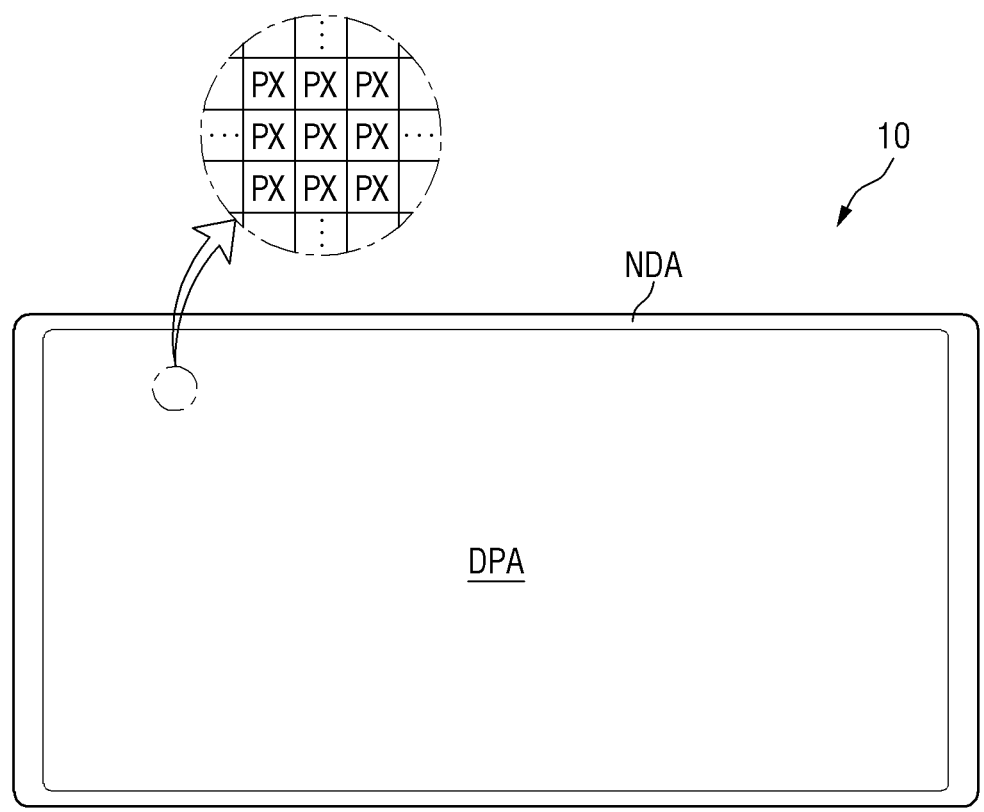
FIG. 1 is a plan view of a display device according to an embodiment of the present disclosure.

Embodiments of the present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those of ordinary skill in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

Hereinafter, embodiments will be described with reference to the accompanying drawings.

FIG. 1 is a plan view of a display device according to an embodiment of the present disclosure.

Referring to FIG. 1, a display device 10 displays a moving image or a still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the present disclosure is not limited thereto. That is, various other display panels are also applicable to the display panel of the display device 10.

The shape of the display device 10 may vary. In one example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a second direction DR2.

The display device 10 may include the display area DPA and a non-display area NDA around (e.g., surrounding) the display area DPA along the edge or periphery of the display area DPA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part (or the central portion) of the display device 10.

The display area DPA may include a plurality of pixels PX. The pixels PX may be arranged along row and column directions. For example, the pixels PX may be arranged along rows and columns of a matrix. Each of the pixels PX may include one or more light-emitting elements, which emit light of a particular wavelength range. Emission parts of the pixels PX where light is emitted may have a rectangular or square shape in a plan view, but the present disclosure is not limited thereto. Alternatively, the emission parts of the pixels PX may have a rhombus shape having sides that are inclined with respect to a particular direction.

The non-display area NDA may be disposed around the display area DPA. The non-display area NDA may be around (e.g., may surround) the entire display area DPA or part of the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
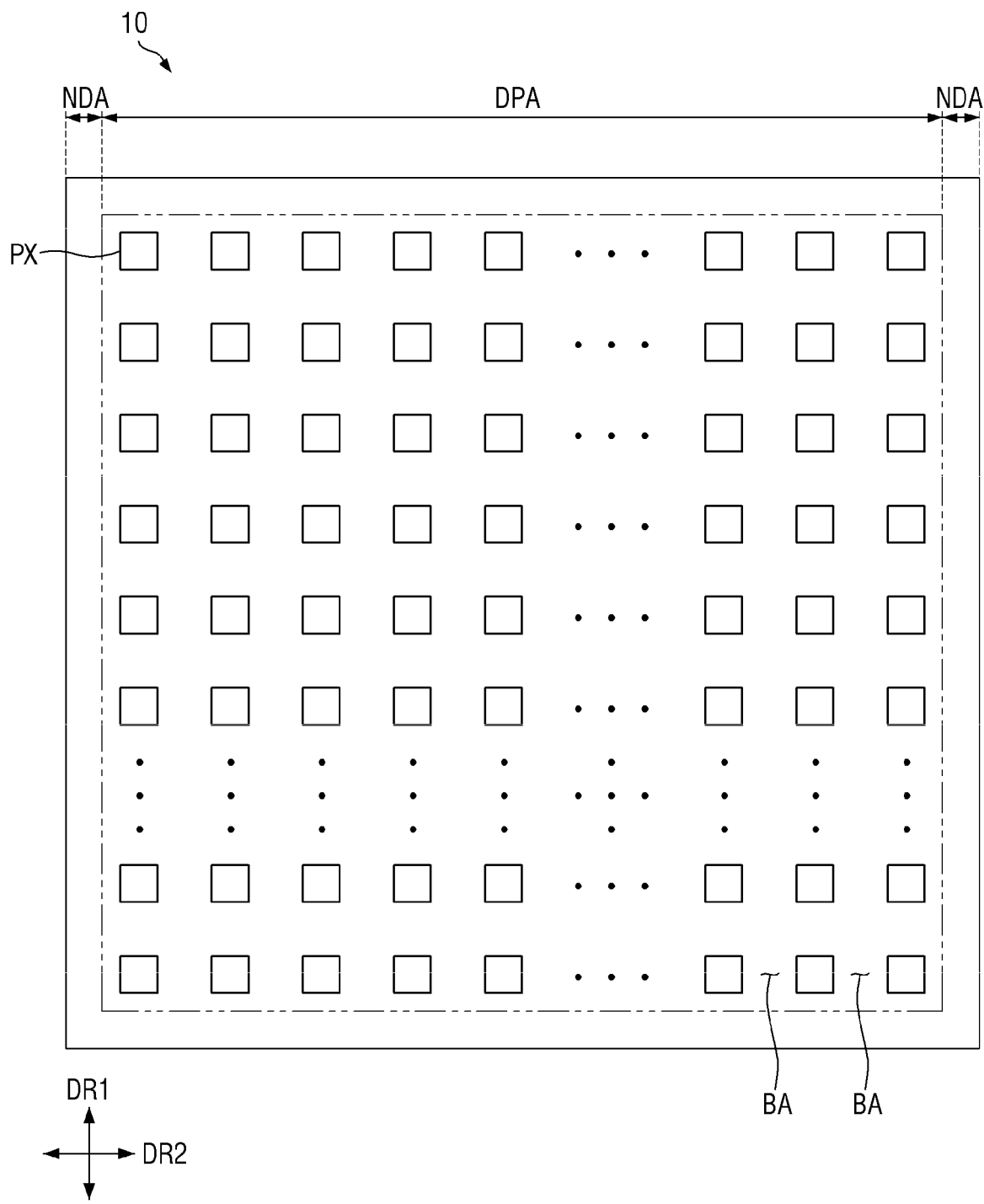
FIG. 2 is a plan view illustrating a display area and a non-display area of the display device of FIG. 1.

FIG. 2 is a plan view illustrating the display area and the non-display area of the display device of FIG. 1.

Referring to FIG. 2, the display device 10 may include a plurality of pixels PX that are arranged along multiple rows and multiple columns. For example, the pixels PX may be arranged along rows and columns of a matrix. The pixels PX may be sequentially arranged along first and second directions DR1 and DR2 in the display area DPA. The display device 10 may include a light-blocking area BA between the pixels PX. The light-blocking area BA can prevent beams of light emitted from different pixels PX from being mixed together.

Each of the pixels PX or each of subpixels SPXn (where n is an integer of 1 to 3) of the display device 10 includes a pixel driving circuit. Lines may be provided to pass through or by each of the pixels PX or each of the subpixels SPXn and apply driving signals to each of the pixel driving circuits. Each of the pixel driving circuits may include transistors and capacitors. The numbers of transistors and capacitors included in each of the pixel driving circuits may vary. In one example, the pixel driving circuits may have a "3T1C" structure including three transistors and one capacitor. The pixel driving circuits will hereinafter be described as having the "3T1C" structure, but the present disclosure is not limited thereto. Alternatively, various other structures such as a "2T1C", "7T1C", or "6T1C" structure may also be applicable to the pixel driving circuits.

Figure 3:
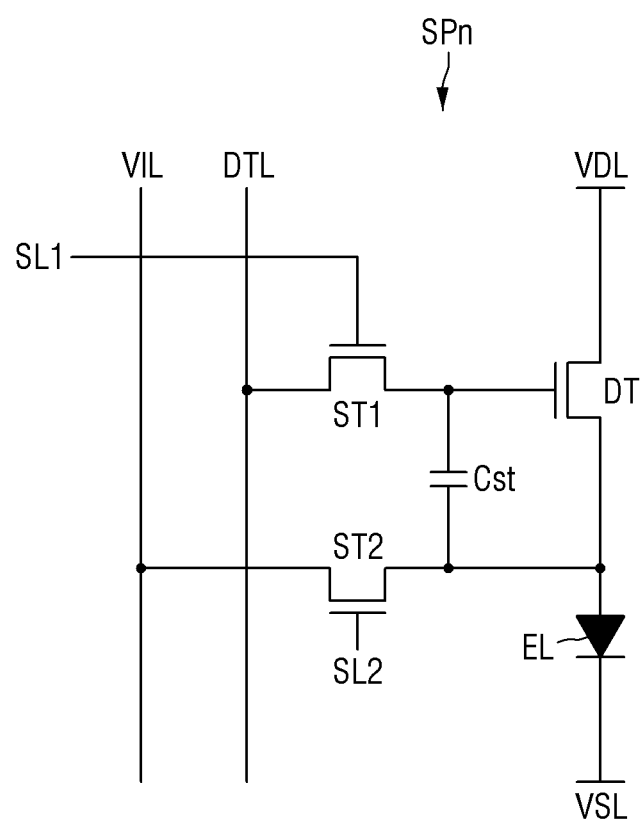
FIG. 3 is an equivalent circuit diagram of a subpixel of the display device of FIG. 1.

FIG. 3 is an equivalent circuit diagram of a subpixel of the display device of FIG. 1.

Referring to FIG. 3, a subpixel SPXn of the display device 10 includes a light-emitting diode (LED) "EL", three transistors, for example, a driving transistor DT and first and second switching transistors ST1 and ST2, and one storage capacitor Cst.

The LED "EL" emits light in accordance with a current applied thereto via the driving transistor DT. The LED "EL" includes a first electrode, a second electrode, and at least one light-emitting element disposed between the first and second electrodes. The light-emitting element may emit light of a particular wavelength range in accordance with electrical signals transmitted thereto from the first and second electrodes.

A first end of the LED "EL" may be connected to the source electrode of the driving transistor DT, and a second end of the LED "EL" may be connected to a second voltage line VSL, to which a low-potential voltage (hereinafter, a second power supply voltage) lower than a high-potential voltage (hereinafter, a first power supply voltage) is supplied. In some embodiments, the first end of the LED "EL" may be connected to the source electrode of the second switching transistor ST2. In some other embodiments, the second end of the LED "EL" may be connected to the source electrode of the first switching transistor ST1.

The driving transistor DT controls a current flowing from the first voltage line VDL, to which the first power supply voltage is supplied, to the LED "EL" in accordance with the difference in voltage between the gate electrode and the source electrode of the driving transistor DT. In one example, the driving transistor DT may be a transistor for driving the LED "EL". The gate electrode of the driving transistor DT may be connected to the source electrode of the first switching transistor ST1, the source electrode of the driving transistor DT may be connected to the first electrode of the LED "EL", and the drain electrode of the driving transistor DT may be connected to the first voltage line VDL, to which the first power supply voltage is supplied.

The first switching transistor ST1 is turned on by a first scan signal from a first scan line SL1 to connect a data line DTL to the gate electrode of the driving transistor DT. The gate electrode of the first switching transistor ST1 may be connected to the first scan line SL1, the source electrode of the first switching transistor ST1 may be connected to the gate electrode of the driving transistor DT, and the drain electrode of the first switching transistor ST1 may be connected to the data line DTL.

The second switching transistor ST2 is turned on by a second scan signal from a second scan line SL2 to connect an initialization voltage line VIL to a first end of the LED "EL". The gate electrode of the second switching transistor ST2 may be connected to the second scan lien SL2, the drain electrode of the second switching transistor ST2 may be connected to the initialization voltage line VIL, and the source electrode of the second switching transistor ST2 may be connected to the first end of the LED "EL" or the source electrode of the driving transistor DT.

The source electrodes and the drain electrodes of the driving transistor and the first and second switching transistors ST1 and ST2 are not limited to the above descriptions. The driving transistor and the first and second switching transistors ST1 and ST2 may be formed as thin-film transistors (TFTs). FIG. 3 illustrates that the driving transistor and the first and second switching transistors ST1 and ST2 are formed as N-type metal-oxide semiconductor field-effect transistors (MOSFETs), but the present disclosure is not limited thereto. That is, alternatively, the driving transistor and the first and second switching transistors ST1 and ST2 may all be formed as P-type MOSFETs. Yet alternatively, some of the driving transistor and the first and second switching transistors ST1 and ST2 may be formed as N-type MOSFETS, and the other transistor(s) may be formed as P-type MOSFETs.

The storage capacitor Cst is formed between the gate electrode and the source electrode of the driving transistor DT. The storage capacitor Cst stores a differential voltage (or charge) corresponding to the difference in voltage between the gate electrode and the source electrode of the driving transistor DT.

The structure of a pixel PX of the display device 10 will hereinafter be described in further detail.

Figure 4:
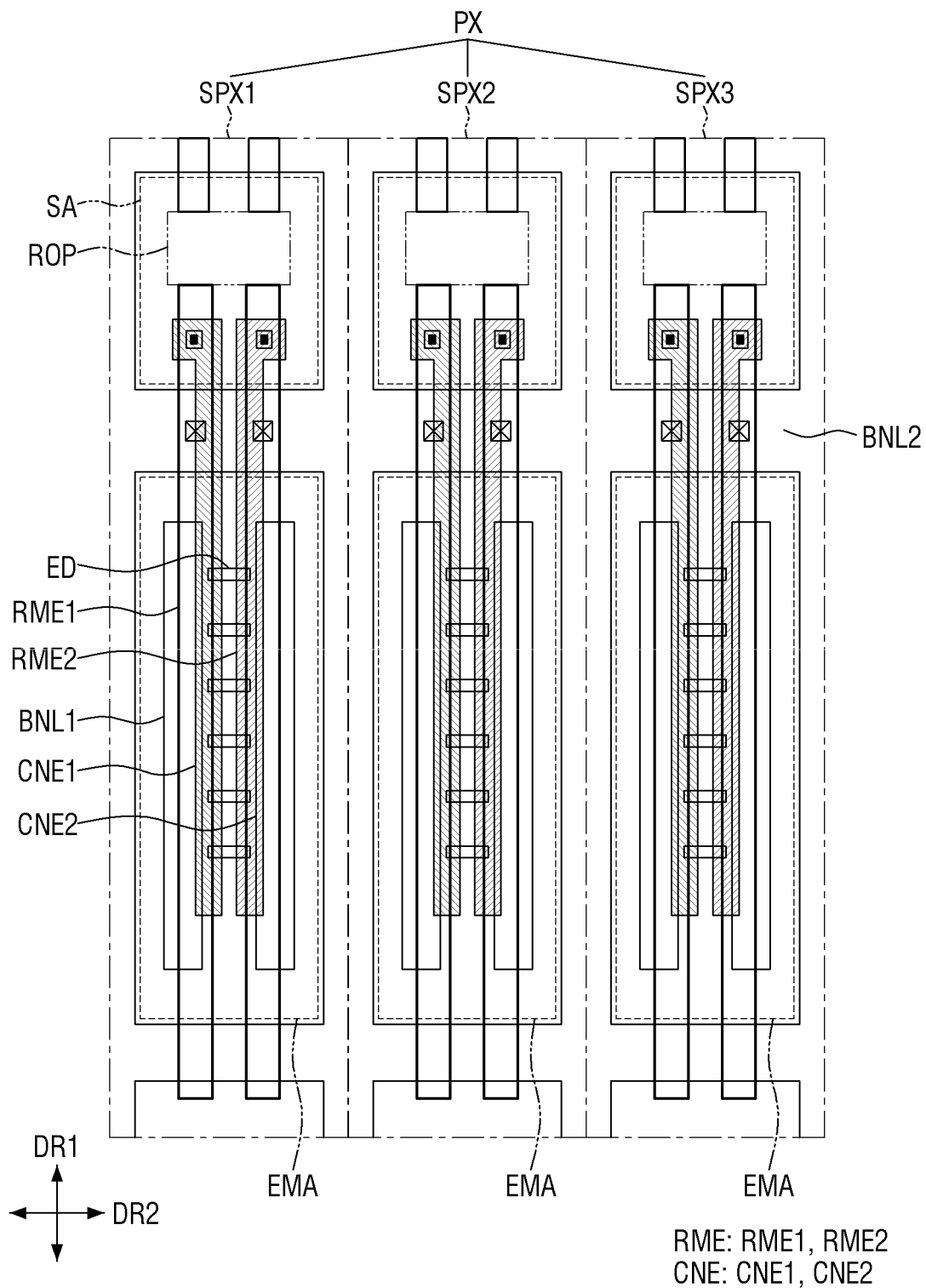
FIG. 4 is a plan view of a pixel of the display device of FIG. 1.

FIG. 4 is a plan view of a pixel of the display device of FIG. 1.

Referring to FIG. 4, a pixel PX may include a plurality of subpixels SPXn (where n is an integer of 1 to 3). In one example, the pixel PX may include first, second, and third subpixels SPX1, SPX2, and SPX3. The first subpixel SPX1 may emit first-color light, the second subpixel SPX2 may emit second-color light, and the third subpixel SPX3 may emit third-color light. In one example, the first-color light, the second-color light, and the third-color light may be blue light, green light, and red light, respectively, but the present disclosure is not limited thereto. Alternatively, the subpixels SPXn may all emit light of the same color. In one example, the subpixels SPXn may all emit blue light. FIG. 4 illustrates that the pixel PX may include three subpixels SPXn, but the present disclosure is not limited thereto. Alternatively, the pixel PX may include more than three subpixels SPXn.

Each of the subpixels SPXn may include an emission area EMA and a non-emission area. The emission area EMA may be an area that outputs light of a particular wavelength range due to light-emitting elements ED being disposed therein, and the non-emission area may be an area which has no light-emitting elements ED disposed therein, is not reached by light emitted by the light-emitting elements ED, and thus does not output light. The emission area EMA may include a region where the light-emitting elements ED are disposed and a region around the light-emitting elements ED where light emitted by the light-emitting elements ED is output.

However, the present disclosure is not limited to this. The emission area EMA may also include regions that output light emitted by the light-emitting elements ED and then reflected or refracted by other members. A plurality of light-emitting elements ED may be disposed in each of the subpixels SPXn to form an emission area EMA including a region in which the plurality of light-emitting elements ED are disposed and the surroundings of the region in which the plurality of light-emitting elements ED are disposed.

FIG. 4 illustrates that the emission areas EMA of the first, second, and third subpixels SPX1, SPX2, and SPX3 have substantially the same size. In some embodiments, the emission areas EMA of the subpixels SPXn may have different sizes depending on the color or the wavelength of light emitted by light-emitting elements ED.

Each of the subpixels SPXn may further include a subarea SA, which is disposed in the non-emission area of the corresponding subpixel SPXn. The subarea SA may be disposed on a first side, in the first direction DR1, of the emission area EMA of the corresponding subpixel SPXn, between the emission area EMA of the corresponding subpixel SPXn and the emission area EMA of a neighboring subpixel SPXn adjacent to the corresponding subpixel SPXn in the first direction DR1. In one example, a plurality of emission areas EMA may be arranged one after another along the second direction DR2, a plurality of subareas SA may be arranged one after another along the second direction DR2, and the plurality of emission areas EMA and the plurality of subareas SA may be alternately arranged along the first direction DR1. However, the present disclosure is not limited to this example.

A second bank BNL2 may be disposed between the subareas SA of the subpixels SPXn, between the emission areas EMA of the subpixels SPXn, and between the subareas SA and the emission areas EMA of the subpixels SPXn. The distances between the subareas SA of the subpixels SPXn, between the emission areas EMA of the subpixels SPXn, and between the subareas SA and the emission areas EMA of the subpixels SPXn may vary depending on the width of the second bank BNL2. As no light-emitting elements ED are disposed in the subareas SA of the subpixels SPXn, no light may be output from the subareas SA of the subpixels SPXn, but electrodes RME may be disposed in part in the subareas SA of the subpixels SPXn. Two groups of electrodes RME from two different subpixels SPXn (that are adjacent in first direction DR1) may be separated from each other in a separation part ROP of a subarea SA of one of the two different subpixels SPXn.

The second bank BNL2 may include parts that extend in the first direction DR1 and parts that extend in the second direction DR2 and may be arranged in a lattice pattern in a plan view, over the entire display area DPA. The second bank BNL2 may be disposed along the boundaries of each of the subpixels SPXn to separate the subpixels SPXn from one another. Also, the second bank BNL2 may be disposed to surround each of the emission areas EMA of the subpixels SPXn to separate the emission areas EMA of the subpixels SPXn from one another.

Figure 5:
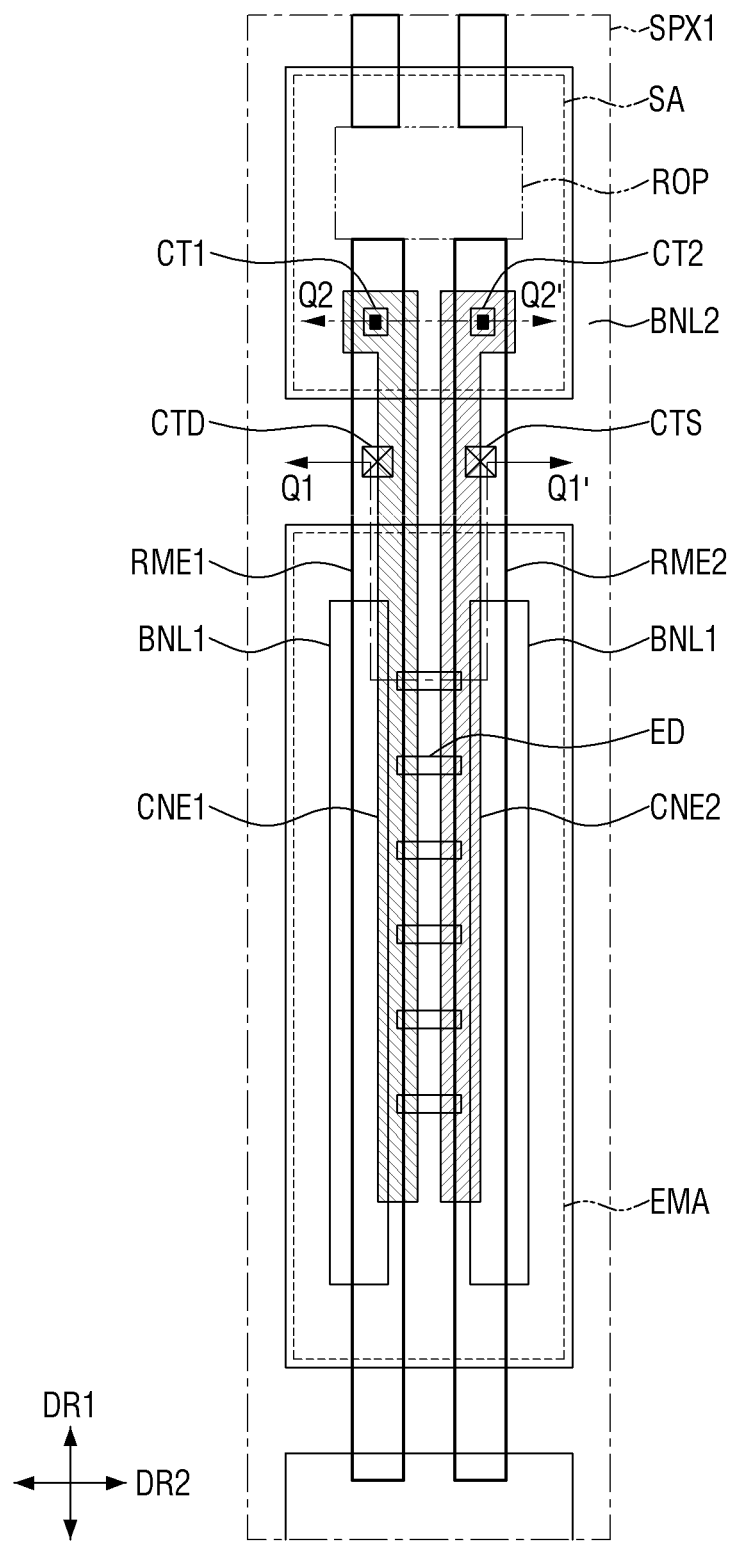
FIG. 5 is a plan view of a first subpixel of FIG. 4.
Figure 6:
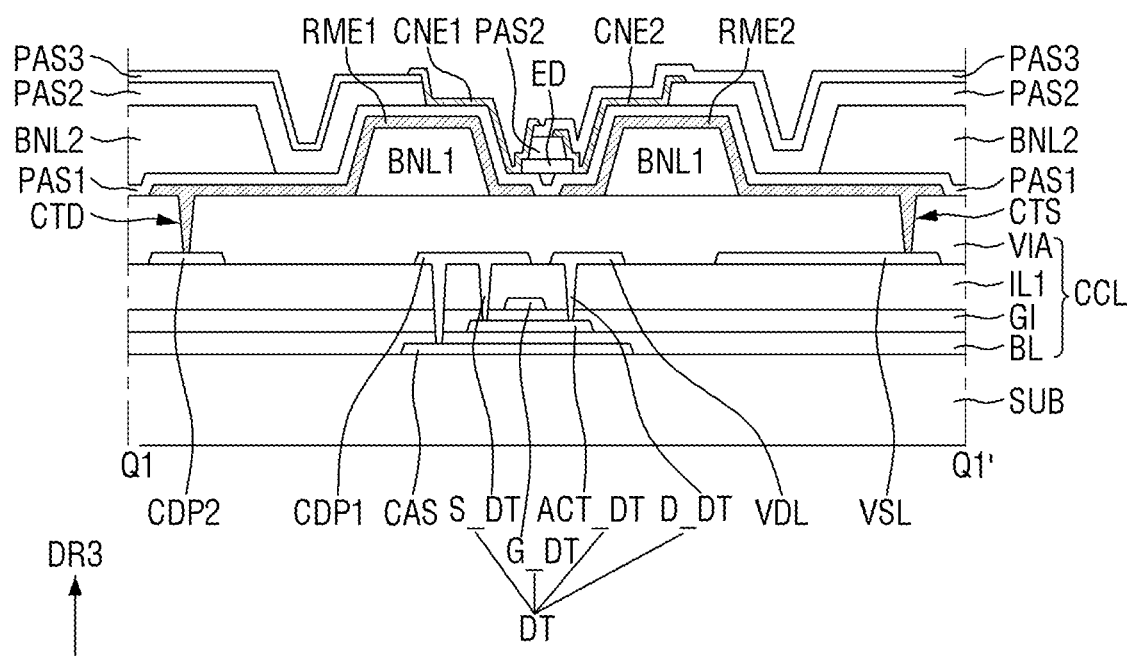
FIG. 6 is a cross-sectional view taken along the line Q1-Q1' of FIG. 5.
Figure 7:
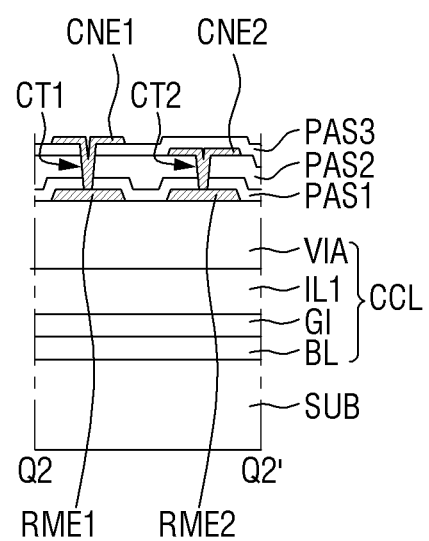
FIG. 7 is a cross-sectional view taken along the line Q2-Q2' of FIG. 5.

FIG. 5 is a plan view of a first subpixel of FIG. 4. FIG. 6 is a cross-sectional view taken along the line Q1-Q1' of FIG. 5. FIG. 7 is a cross-sectional view taken along the line Q2-Q2' of FIG. 5. FIG. 5 illustrates a first subpixel SPX1 of a pixel PX, and FIG. 6 illustrates a cross-sectional view taken from one end portion to the other end portion of a light-emitting element ED included in the first subpixel SPX1 of FIG. 5. FIG. 7 illustrates a cross-sectional view taken across a plurality of contacts (i.e., first and second contacts CT1 and CT2) of the first subpixel SPX1 of FIG. 5.

Referring to FIGS. 5-7 and further to FIG. 4, the display device 10 may include, in the first subpixel SPX1, the first substrate SUB and may further include an active layer, a plurality of conductive layers, and a plurality of insulating layers that are disposed on the first substrate SUB. The active layer, the conductive layers, and the insulating layers may form a circuit layer CCL and a display element layer of the display device 10.

The first substrate SUB may be an insulating substrate. The first substrate SUB may be formed of an insulating material such as glass, quartz, or a polymer resin. The first substrate SUB may be a rigid substrate or may be a flexible substrate that is bendable, foldable, and/or rollable.

A first conductive layer may be disposed on the first substrate SUB. The first conductive layer includes a lower metal layer CAS, and the lower metal layer CAS is disposed to overlap with an active layer ACT_DT of a driving transistor DT in a thickness direction of the first substrate SUB (e.g., a third direction DR3). The lower metal layer CAS may include a material capable of blocking the transmission of light and may prevent light from being incident upon the active layer ACT_DT of the driving transistor DT. The lower metal layer CAS may not be provided.

A buffer layer BL may be disposed on the lower metal layer CAS and the first substrate SUB. The buffer layer BL may be formed on the first substrate SUB to protect the transistors of the first subpixel SPX1 from moisture that may penetrate through the first substrate SUB, which is vulnerable to moisture, and may perform a surface planarization function.

The active layer is disposed on the buffer layer BL. The active layer may include the active layer ACT_DT of the driving transistor DT. The active layer ACT_DT of the driving transistor DT may be disposed to partially overlap with a gate electrode G_DT in a second conductive layer, which will be described later, in the thickness direction of the first substrate SUB (e.g., the third direction DR3).

The active layer may include polycrystalline silicon, monocrystalline silicon, or an oxide semiconductor. Alternatively, the semiconductor layer may include polycrystalline silicon. The oxide semiconductor may be an oxide semiconductor containing indium (In). In one example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 4-7 illustrate that the first subpixel SPX1 includes only one transistor, i.e., the driving transistor DT, but the present disclosure is not limited thereto. That is, the first subpixel SPX1 may include more than one transistor.

A first gate insulating layer GI is disposed on the active layer ACT_DT and the buffer layer BL. The first gate insulating layer GI may function as a gate insulating film for the driving transistor DT.

A second conductive layer is disposed on the first gate insulating layer GI.

The second conductive layer may include a gate electrode G_DT of the driving transistor DT. The gate electrode G_DT may be disposed to overlap with the channel region of the active layer ACT_DT in the thickness direction of the first substrate SUB, i.e., in the third direction DR3.

A first interlayer insulating layer IL1 is disposed on the second conductive layer. The first interlayer insulating layer IL1 may function as an insulating film between the second conductive layer and layers disposed on the second conductive layer and may protect the second conductive layer.

A third conductive layer is disposed on the first interlayer insulating layer IL1. The third conductive layer may include first and second voltage lines VDL and VSL and a plurality of electrode patterns (e.g., CDP1 and CDP2).

A high-potential voltage (or a first power supply voltage) to be delivered to a first electrode RME1 may be applied to the first voltage line VDL, and a low-potential voltage (or a second power supply voltage) to be delivered to a second electrode RME2 may be applied to the second voltage line VSL. Part of the first voltage line VDL may be in contact with the active layer ACT_DT of the driving transistor DT through a contact hole that penetrates the first interlayer insulating layer IL1 and the first gate insulating layer GI. The first voltage line VDL may function as a first drain electrode D_DT of the driving transistor DT.

In some embodiments, a first power supply voltage may be applied to the first voltage line VDL, and the driving transistor DT may be connected to the first voltage line VDL. In this case, the first voltage line VDL may function as the first drain electrode D_DT of the driving transistor DT.

A first electrode pattern CDP1 may be in contact with the active layer ACT_DT of the driving transistor DT through a contact hole that penetrates the first interlayer insulating layer IL1 and the first gate insulating layer GI. Also, the first electrode pattern CDP1 may be in contact with the lower metal layer CAS through another contact hole that penetrates the first interlayer insulating layer IL1, the first gate insulating layer GI, and the buffer layer BL. The first electrode pattern CDP1 may function as a first source electrode S_DT of the driving transistor DT.

A second electrode pattern CDP2 may be electrically connected to the driving transistor DT via the first electrode pattern CDP1. The first and second electrode patterns CDP1 and CDP2 are illustrated as being spaced from each other, but alternatively, the first and second electrode patterns CDP1 and CDP2 may be connected to each other directly or via another pattern from a different layer. In some embodiments, the second electrode pattern CDP2 may be integrally formed with the first electrode pattern CDP1 and may thus form a single pattern together with the first electrode pattern CDP1. The second electrode pattern CDP2 may be connected to the first electrode RME1, and the driving transistor DT may transmit the first power supply voltage applied thereto from the first voltage line VDL to the first electrode RME1.

The first and second electrode patterns CDP1 and CDP2 are illustrated as being formed at the same layer, but the present disclosure is not limited thereto. Alternatively, the second electrode pattern CDP2 may be formed in a different conductive layer from the first electrode pattern CDP1, for example, in a fourth conductive layer disposed on the third conductive layer with a number of insulating layers interposed therebetween. In this case, the first and second voltage lines VDL and VSL may be formed in the fourth conductive layer, rather than in the third conductive layer, and the first voltage line VDL may be electrically connected to the drain electrode D_DT of the driving transistor DT via another electrode pattern. In some embodiments, the second and third conductive layers may include electrodes of a storage capacitor. The electrodes of the storage capacitor may be disposed in different layers and may form a capacitor in the first interlayer insulating layer IL1 together. In some embodiments, the electrodes of the storage capacitor may be integrally formed with the gate electrode G_DT and the source electrode S_DT of the driving transistor DT, but the present disclosure is not limited thereto.

Each of the buffer layer BL, the first gate insulating layer GI, and the first interlayer insulating layer IL1 may consist of a plurality of inorganic layers that are alternately stacked. In one example, each of the buffer layer BL, the first gate insulating layer GI, and the first interlayer insulating layer IL1 may be formed as a double- or multilayer in which inorganic layers of at least one of silicon oxide ($SiO_x$), silicon nitride ($SiN_x$), and silicon oxynitride ($SiO_xN_y$) are alternately stacked, but the present disclosure is not limited thereto. In another example, each of the buffer layer BL, the first gate insulating layer GI, and the first interlayer insulating layer IL1 may be formed as a single inorganic layer including silicon oxide ($SiO_x$), silicon nitride ($SiN_x$), or silicon oxynitride ($SiO_xN_y$). Also, in some embodiments, the first interlayer insulating layer IL1 may be formed of an organic insulating material such as polyimide (PI).

The second and third conductive layers may be formed as single layers or multilayers including molybdenum (Mo), aluminum (Al), chromium (Cr), gold (Au), titanium (Ti), nickel (Ni), neodymium (Nd), copper (Cu), or an alloy thereof, but the present disclosure is not limited thereto.

A via layer VIA is disposed on the third conductive layer. The via layer VIA may include an organic insulating material such as, for example, polyimide (PI), and may perform a surface planarization function.

A plurality of electrodes RME, a plurality of first banks BNL1, a second bank BNL2, a plurality of light-emitting elements ED, and a plurality of connecting electrodes CNE are disposed on the via layer VIA. A plurality of first, second, and third insulating layers PAS1, PAS2, and PAS3 may be disposed on the via layer VIA.

The first banks BNL1 may be disposed directly on the via layer VIA. The first banks BNL1 may extend in the first direction DR1 and may be spaced from each other in the second direction DR2. In one example, the first banks BNL1 may extend in the first direction DR1 in the emission area EMA and may be disposed on both sides, in the second direction DR2, of the center of the emission area EMA. The first banks BNL1 may be spaced from each other in the second direction DR2, and the light-emitting elements ED may be disposed between the first banks BNL1.

The length, in the first direction DR1, of the first banks BNL1 may be smaller than the length, in the first direction DR1, of the emission area EMA surrounded by the second bank BNL2. In the display area DPA, the first banks BNL1 may be disposed in the emission area EMA, over the entire display area DPA, to form island patterns that are narrow and extend in one direction (e.g., the first direction DR1).

The first banks BNL1 may protrude at least in part from the top surface of the via layer VIA. Each of protruding parts of the first banks BNL1 may have inclined side surfaces, and light emitted by the light-emitting elements ED may be reflected by the electrodes RME on the first banks BNL1 to be emitted upwardly from the via layer VIA. However, the present disclosure is not limited to this. Alternatively, each of the first banks BNL1 may have a semicircular or semielliptical shape on the outside thereof. The first banks BNL1 may include an organic insulating material such as polyimide (PI), but the present disclosure is not limited thereto.

A plurality of electrodes RME may be disposed in the first subpixel SPX1 to extend in one direction (e.g., the first direction DR1). The electrodes RME may extend in the first direction DR1 to be disposed in and across the emission area EMA and the subarea SA of the first subpixel SPX1 and may be spaced from each other in the second direction DR2.

The first and second electrodes RME1 and RME2 may be disposed in the first subpixel SPX1 to be spaced from each other in the second direction DR2. The first and second electrodes RME1 and RME2 may be disposed to be spaced from each other in the first direction DR1 in the emission area EMA of the first subpixel SPX1 and may extend beyond the second bank BNL2 to be disposed in part in a subarea SA of a neighboring subpixel SPXn adjacent to the first subpixel SPX1 in the first direction DR1. Two groups of electrodes RME of two different subpixels SPXn, for example, the first and second electrodes RME1 and RME2 of the first subpixel SPX1 and first and second electrodes RME1 and RME2 of a subpixel SPXn adjacent to the first subpixel SPX1 in the first direction DR1, may be spaced by a separation part ROP of the subarea SA of the first subpixel SPX1 and a subarea SA of another neighboring subpixel SPXn adjacent to the first subpixel SPX1 in the first direction DR1.

The electrodes RME may be obtained by forming electrode lines that extend in the first direction DR1 and cutting up the electrode lines after the arrangement of the light-emitting elements ED in the first subpixel SPX1. The electrode lines may be used to generate an electric field in the first subpixel SPX1 to align the light-emitting elements ED in the first subpixel SPX1, during the fabrication of the display device 10. Once the light-emitting elements ED are aligned, the electrode lines may be cut up in the separation part ROP of the first subpixel SPX1, thereby forming electrodes RME that are spaced from each other in the first direction DR1.

The first and second electrodes RME1 and RME2 may be disposed on different first banks BNL1. The first electrode RME1 may be disposed on the left side of the center of the emission area EMA and may be placed in part on the left first bank BNL1. The second electrode RME2 may be spaced from the first electrode RME1 in the second direction DR2 and may be disposed on the right side of the center of the emission area EMA. The second electrode RME2 may be placed in part on the right first bank BNL1.

The electrodes RME may be disposed on at least inclined side surfaces of the first banks BNL1. In one example, the width, in the second direction DR2, of the electrodes RME may be smaller than the width, in the second direction DR2, of the first banks BNL1 or the second bank BNL2. The electrodes RME may be disposed to cover at least one side surface of each of the first banks BNL1 and thus to reflect light emitted by the light-emitting elements ED.

The distance, in the second direction DR2, between the electrodes RME may be smaller than the distance, in the second direction DR2, between the first banks BNL1. At least parts of the electrodes RME may be disposed directly on the via layer VIA and may thus fall on (or at) the same plane.

The first and second electrodes RME1 and RME2 may be connected to the third conductive layer through first and second electrode contact holes CTD and CTS, respectively, which are formed in an area that overlaps with the second bank BNL2 in the third direction DR3. The first electrode RME1 may be in contact with the second electrode pattern CDP2 through the first electrode contact hole CTD, which penetrates the via layer VIA. The second electrode RME2 may be in contact with the second voltage line VSL through the second electrode contact hole CTS, which penetrates the via layer VIA. The first electrode RME1 may be electrically connected to the driving transistor DT via the first and second electrode patterns CDP1 and CDP2 and may thus receive the first power supply voltage, and the second electrode may be electrically connected to the second voltage line VSL and may thus receive the second power supply voltage.

However, the present disclosure is not limited to this. Alternatively, the first electrode RME1 may be electrically connected to the second voltage line VSL, and the second electrode RME2 may be electrically connected to the first voltage line VDL. As will be described later, the patterns of arrangement of the electrodes RME and the light-emitting elements ED may vary depending on the types of lines used to align the light-emitting elements ED. The first and second electrode contact holes CTD and CTS are illustrated as being located below the second bank BNL2, but the present disclosure is not limited thereto. Alternatively, the first and second electrode contact holes CTD and CTS may be formed inside the emission area EMA or the subarea SA.

The electrodes RME may be electrically connected to the light-emitting elements ED. The electrodes RME may be connected to the light-emitting elements ED via the connecting electrodes CNE and may transmit electrical signals applied thereto from the conductive layers below the via layer VIA to the light-emitting elements ED.

The electrodes RME may include a conductive material with high reflectance. In one example, the electrodes RME may include a material with high reflectance, for example, a metal such as silver (Ag), Cu, or Al or an alloy of Al, Ni, or lanthanum (La). The electrodes RME may upwardly reflect light emitted by the light-emitting elements ED and then traveling toward side surfaces of the first banks BNL1.

However, the present disclosure is not limited to this. Alternatively, the electrodes RME may further include a transparent conductive material. In one example, the electrodes RME may include a material such as ITO, IZO, or ITZO. In some embodiments, the electrodes RME may be formed as a stack of more than one layer of a transparent conductive material and more than one metal layer with high reflectance or as single layers including a transparent conductive material and a metal with high reflectance. In one example, the electrodes RME may have a stack of ITO/Ag/ITO/, ITO/Ag/IZO, or ITO/Ag/ITZO/IZO.

The first insulating layer PAS1 is disposed on the via layer VIA and the electrodes RME. The first insulating layer PAS1 may be disposed to cover (e.g., completely cover) the electrodes RME and may protect and insulate the electrodes RME. Also, the first insulating layer PAS1 may prevent the light-emitting elements ED, which are disposed on the first insulating layer PAS1, from being placed in contact with, and damaged by, other elements.

In one example, the first insulating layer PAS1 may be formed to be recessed in part between electrodes RME that are spaced from each other in the second direction DR2. The light-emitting elements ED may be disposed on the top surface of part of the first insulating layer PAS1 that is recessed, and space may be formed between the light-emitting elements ED and the first insulating layer PAS1.

The first insulating layer PAS1 may include the first and second contacts CT1 and CT2, which expose parts of the top surfaces of the electrodes RME. The first and second contacts CT1 and CT2 may penetrate the first insulating layer PAS1 (and a second insulating layer PAS2 (see, for example, FIG. 7)), and the connecting electrodes CNE that will be described later may be in contact with parts of the electrodes RME exposed by the first and second contacts CT1 and CT2.

The second bank BNL2 may be disposed on the first insulating layer PAS1.

The second bank BNL2 may include parts that extend in the first direction DR1 and parts that extend in the second direction DR2 and may thus be arranged in a lattice pattern in a plan view. The second bank BNL2 may be disposed along the boundaries of the first subpixel SPX1 to separate the first subpixel SPX1 from other neighboring subpixels SPXn. Also, the second bank BNL2 may be disposed to be around (e.g., surround) the emission area EMA and the subarea of the first subpixel SPX1, and areas that are defined and opened by the second bank BNL2 may be the emission area EMA and the subarea SA of the first subpixel SPX1.

The second bank BNL2 may have a suitable height (e.g., a predetermined height). In some embodiments, the height of the second bank BNL2 may be greater than the height of the first banks BNL1, and the thickness of the second bank BNL2 may be the same as, or greater than, the thickness of the first banks BNL1. The second bank BNL2 may prevent ink from spilling over from one subpixel SPXn to another subpixel SPXn (e.g., an adjacent subpixel) during inkjet printing as performed during the fabrication of the display device 10. The second bank BNL2 may prevent ink having different groups of light-emitting elements ED for different subpixels SPXn from being mixed together. The second bank BNL2, like the first banks BNL1, may include polyimide (PI), but the present disclosure is not limited thereto.

The light-emitting elements ED may be disposed on the first insulating layer PAS1 between the electrodes RME. Each of the light-emitting elements ED may include a plurality of layers that are arranged along a direction parallel to the top surface of the first substrate SUB. The light-emitting elements ED may be arranged such that a direction in which the light-emitting elements ED extend may be parallel to the first substrate SUB, and the semiconductor layers included in each of the light-emitting elements ED may be sequentially arranged along a direction parallel to the top surface of the first substrate SUB. However, the present disclosure is not limited to this. Alternatively, the plurality of layers included in each of the light-emitting elements ED may be arranged in a direction perpendicular to the first substrate SUB.

The light-emitting elements ED may be disposed on the electrodes RME that are spaced from each other in the second direction DR2, between the first banks BNL1. The light-emitting elements ED may be disposed to be spaced from one another in the direction in which the electrodes RME extend, i.e., in the first direction DR1, and may be aligned substantially in parallel to one another. The light-emitting elements ED may extend in one direction, and the length of the light-emitting elements ED may be greater than the distance between the electrodes RME that are spaced from each other in the second direction DR2. The light-emitting elements ED may be arranged such that both end portions thereof may be placed on different electrodes RME, and that the direction in which the electrodes RME extend (e.g., the first direction DR1) may substantially form a right angle with the direction (e.g., the second direction DR2) in which the light-emitting elements ED extend. However, the present disclosure is not limited to this. Alternatively, the light-emitting elements ED may be arranged at an inclination with respect to the direction in which the electrodes RME extend (e.g., the first direction DR1).

The light-emitting elements ED may emit light of different wavelength ranges depending on the materials of semiconductor layers included therein, but the present disclosure is not limited thereto. Alternatively, the light-emitting elements ED may emit light of the same color. Also, each of the light-emitting elements ED may include semiconductor layers that are doped with dopants of different conductivity types and may be aligned such that one end portion thereof may be oriented in a particular direction by an electric field formed between the electrodes RME.

Each of the light-emitting elements ED may include a plurality of semiconductor layers, and first and second end portions of each of the light-emitting elements ED may be defined based on one of the plurality of semiconductor layers. First end portions of the light-emitting elements ED may be disposed on the first electrode RME1, and second end portions of the light-emitting elements ED may be disposed on the second electrode RME2. The first end portions of the light-emitting elements ED may face a second side in the second direction DR2, i.e., the left side.

The light-emitting elements ED may be in contact with the connecting electrodes CNE and may thus be electrically connected to the electrodes RME. As some of the semiconductor layers included in each of the light-emitting elements ED are exposed at both ends, in the length direction, of each of the light-emitting elements ED, the exposed semiconductor layers may be in contact with the connecting electrodes CNE. The light-emitting elements ED may be electrically connected to the electrodes RME or the conductive layers below the via layer VIA through the connecting electrodes CNE, and electrical signals may be applied to the light-emitting elements ED so that the light-emitting elements ED may emit light of a particular wavelength range.

The second insulating layer PAS2 may be disposed on the light-emitting elements ED. In one example, the second insulating layer PAS2 may be disposed to cover parts of the outer surfaces of the light-emitting elements ED, but not cover both sides or both end portions of each of the light-emitting elements ED. Parts of the second insulating layer PAS2 on the light-emitting elements ED extend in the first direction DR1 over the first insulating layer PAS1, in a plan view, and may thus form linear or island patterns in the first subpixel SPX1. The second insulating layer PAS2 may protect and fix the light-emitting elements ED during the fabrication of the display device 10. Also, the second insulating layer PAS2 may be disposed to fill the space between the light-emitting elements ED and the first insulating layer PAS1.

The second insulating layer PAS2 may also be disposed even on the first banks BNL1 and the second bank BNL2. The second insulating layer PAS2 may be disposed on the first insulating layer PAS1, but may expose both end portions of each of the light-emitting elements ED and parts of areas where the electrodes RME are to be disposed. The second insulating layer PAS2 may be initially formed on the entire surface of the first insulating layer PAS1 and may then be partially removed to expose both end portions of each of the light-emitting elements ED.

The second insulating layer PAS2 may also be disposed even in the subarea SA of the first subpixel SPX1. The first and second insulating layers PAS1 and PAS2 may be partially removed during the cutting up of electrode lines after the arrangement of the light-emitting elements ED, and part of the via layer VIA may be exposed in the separation part ROP. The third insulating layer PAS3 may be disposed directly on the exposed part of the via layer VIA.

The connecting electrodes CNE and the third insulating layer PAS3 may be disposed on the second insulating layer PAS2.

The connecting electrodes CNE may be disposed on the light-emitting elements ED and the electrodes RME. The connecting electrodes CNE may be disposed in part on the second insulating layer PAS2 and may be insulated from each other by the second and third insulating layers PAS2 and PAS3. The connecting electrodes CNE may be in contact with the light-emitting elements ED and the electrodes RME. The connecting electrodes CNE may be in direct contact with the semiconductor layers disposed at both ends of each of the light-emitting elements ED and may be in contact with at least one of the electrodes RME through the first and second contacts CT1 and CT2. Both end portions of each of the light-emitting elements ED may be electrically connected to the electrodes RME via the connecting electrodes CNE.

A first connecting electrode CNE1 may extend in the first direction DR1 and may be disposed on the first electrode RME1. The first connecting electrode CNE1 may be in contact with the first electrode RME1 through a first contact CT1, which exposes the top surface of the first electrode RME1, and with the first end portions of the light-emitting elements ED. A second connecting electrode CNE2 may extend in the first direction DR1 and may be disposed on the second electrode RME2. The second connecting electrode CNE2 may be in contact with the second electrode RME2 through a second contact CT2, which exposes the top surface of the second electrode RME2, and with the second end portions of the light-emitting elements ED. The first and second connecting electrodes CNE1 and CNE2 may transmit electrical signals applied to the first and second electrodes RME1 and RME2 to the light-emitting elements ED.

The connecting electrodes CNE may be spaced from each other in the second direction DR2 in a plan view. The first and second connecting electrodes CNE1 and CNE2 may be spaced from each other (e.g., a predetermined distance apart from each other) so that they are not directly connected to each other. The connecting electrodes CNE may be not only spaced from each other so that they are not directly connected to each other, but also insulated from each other by the third insulating layer PAS3 (and the second insulating layer PAS2) disposed therebetween.

The first and second contacts CT1 and CT2 may be disposed not to overlap with the light-emitting elements ED in the third direction DR3. In one example, the first and second contacts CT1 and CT2 may be formed to be apart from the region where the light-emitting elements ED are disposed, in the first direction DR1. The first and second contacts CT1 and CT2 are illustrated as being disposed in the subarea SA, but the present disclosure is not limited thereto. Alternatively, the first and second contacts CT1 and CT2 may be formed in part of the emission area EMA where the light-emitting elements ED are not disposed.

The connecting electrodes CNE may include a conductive material. In one example, the connecting electrodes CNE may include ITO, IZO, ITZO, or Al. The connecting electrodes CNE may include, for example, a transparent conductive material, and light emitted from the light-emitting elements ED may travel toward the electrodes RME through the connecting electrodes CNE. However, the present disclosure is not limited to this.

The third insulating layer PAS3 is disposed on the second connecting electrode CNE2 and the second insulating layer PAS2. The third insulating layer PAS3 may be disposed on the entire surface of the second insulating layer PAS2 to cover the second connecting electrode CNE2, and the first connecting electrode CNE1 may be disposed on the third insulating layer PAS3. The third insulating layer PAS3 may be disposed on the entire surface of the via layer VIA except for a region where the first connecting electrode CNE1 is disposed. That is, the third insulating layer PAS3 may be disposed not only on the first and second insulating layers PAS1 and PAS2, but also on the first banks BNL1 and the second bank BNL2. The third insulating layer PAS3 may insulate the first and second connecting electrodes CNE1 and CNE2 not to be in direct contact with each other.

In some embodiments, the third insulating layer PAS3 may not be provided. In this case, the connecting electrodes CNE may be disposed directly on the second insulating layer PAS2 and may thus be placed in substantially the same layer.

In some embodiments, an additional insulating layer may be further disposed on the first connecting electrode CNE1 and the third insulating layer PAS3. The additional insulating layer may protect the elements disposed on the first substrate SUB from an external environment.

The first, second, and third insulating layers PAS1, PAS2, and PAS3 may include an inorganic insulating material or an organic insulating material, but the present disclosure is not limited thereto.

Figure 8:
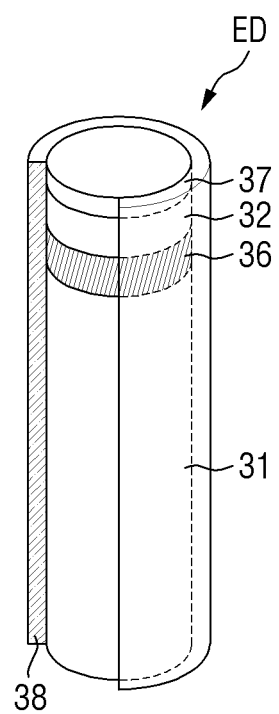
FIG. 8 is a perspective cutaway view of a light-emitting element according to an embodiment of the present disclosure.

FIG. 8 is a perspective cutaway view of a light-emitting element according to an embodiment of the present disclosure.

Referring to FIG. 8, a light-emitting element ED may be a light-emitting diode (LED), particularly, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in one direction. The light-emitting element ED may have the shape of a cylinder, a rod, a wire, or a tube, but the shape of the light-emitting element ED is not particularly limited. Alternatively, the light-emitting element ED may have the shape of a polygonal column such as a regular cube, a rectangular parallelepiped, or a hexagonal column or may have a shape that extends in one direction but with a partially inclined outer surface.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, the light-emitting layer 36, an electrode layer 37, and the insulating film 38.

The first semiconductor layer 31 may include an n-type semiconductor. The first semiconductor layer 31 may include a semiconductor material, i.e., $Al_xGa_yIn_{1-x-y}N$ (where $0 \le x \le 1$, $0 \le y \le 1$, and $0 \le x+y \le 1$). In one example, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0 \le y \le 1$, $0 \le y \le 1$, and $0 \le x+y \le 1$). In one example, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 8 illustrates that the first and second semiconductor layers 31 and 32 are formed as single layers, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. The light-emitting layer 36 may include a material such as AlGaN or AlGaInN. In particular, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

The light-emitting layer 36 may have a structure in which a semiconductor material having a large band gap energy and a semiconductor material having a small band gap energy are alternately stacked or may include group-III or group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be disposed on the second semiconductor layer 32. The electrode layer 37 may be disposed at a surface of the second semiconductor layer 32 that is opposite to a surface of the second semiconductor layer 32 that is in contact with the light-emitting layer 36. The electrode layer 37 may be an ohmic connecting electrode, but the present disclosure is not limited thereto. Alternatively, the electrode layer 37 may be a Schottky connecting electrode. The light-emitting element ED may include at least one electrode layer 37. The light-emitting element ED may include more than one electrode layer 37, but the present disclosure is not limited thereto. For example, an additional electrode layer 37 may be disposed at a surface of the first semiconductor layer 31 that is opposite to a surface of the first semiconductor layer 31 that is in contact with the light-emitting layer 36.

Alternatively, the electrode layer 37 may not be provided.

The electrode layer 37 may reduce the resistance between the light-emitting element ED and electrodes RME or connecting electrodes CNE when the light-emitting element ED is electrically connected to the electrodes RME or the connecting electrodes CNE. The electrode layer 37 may include a conductive metal. In one example, the electrode layer 37 may include at least one of Al, Ti, In, gold (Au), Ag, ITO, IZO, and ITZO.

The insulating film 38 may be disposed to be around (e.g., surround) the outer surfaces (e.g., outer peripheral surfaces) of the first and second semiconductor layers 31 and 32, the light-emitting layer 36, and the electrode layer 37. In one example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride (AlNx), or aluminum oxide ($AlO_x$). The insulating film 38 is illustrated as being a single-layer film, but the present disclosure is not limited thereto. Alternatively, in some embodiments, the insulating film 38 may be formed as a multilayer film in which multiple layers are stacked.

The insulating film 38 may protect the other elements of the light-emitting element ED. The insulating film 38 can prevent any short circuit that may occur in the light-emitting element 36 in case that the light-emitting element ED is in direct contact with electrodes to which electrical signals are applied. Also, the insulating film 38 can prevent the degradation of the emission efficiency of the light-emitting element ED.

The outer surface of the insulating film 38 may be subjected to surface treatment. The light-emitting element ED may be sprayed on electrodes while being dispersed in ink (e.g., predetermined ink). Here, the surface of the insulating film 38 may be hydrophobically or hydrophilically treated to keep the light-emitting element ED dispersed in ink without agglomerating with other neighboring light-emitting elements ED.

As described above, a plurality of light-emitting elements ED are disposed on electrodes RME. In one example, the light-emitting elements ED may be prepared in a state of being dispersed in ink and may be obtained by a printing process using an inkjet printing device. The ink including the light-emitting elements ED may be sprayed on the electrodes RME, alignment voltages may be applied to the electrodes RME, and as a result, the alignment direction and the location of the light-emitting elements ED change, the light-emitting elements ED may be placed on the electrodes RME.

As solvent molecules of the ink including the light-emitting elements ED are seated on the electrodes RME, which are electrically connected to a circuit layer CCL, static electricity may be generated due to the surface friction between the ink and the electrodes RME. The static electricity may interfere with the alignment of the light-emitting elements ED and may damage light-emitting layers 36 of the light-emitting elements ED. As the display device 10 includes a circuit (or a virtual circuit) for removing static electricity that may be generated on the electrodes RME during inkjet printing, the misalignment of, and damage to, the light-emitting elements ED can be prevented or reduced.

Figure 9:
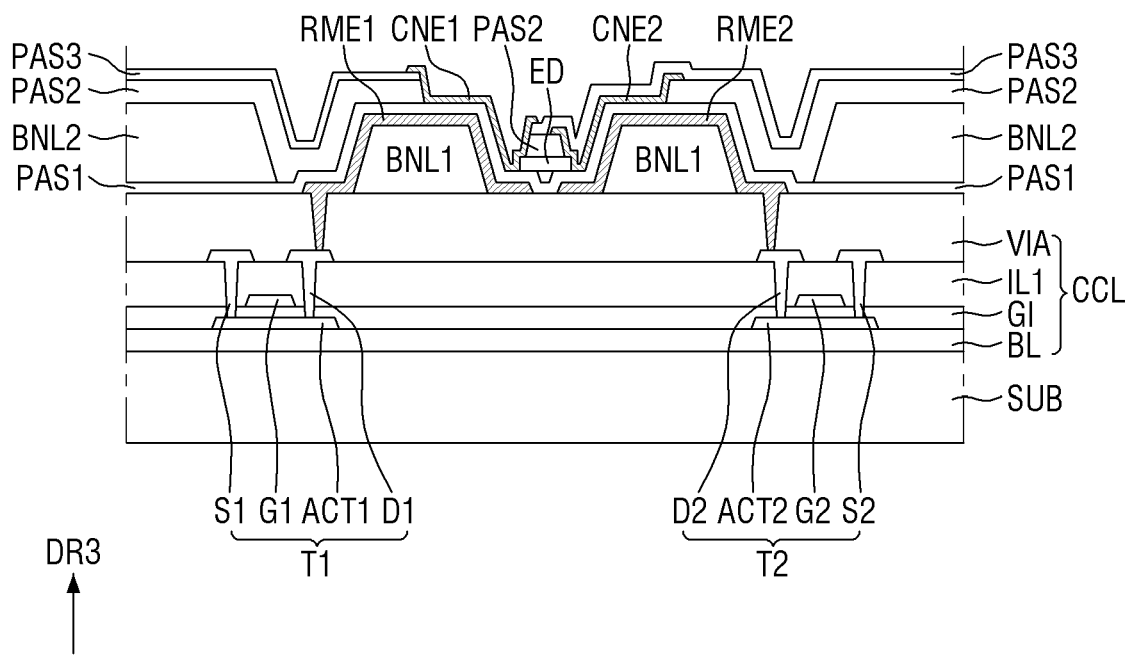
FIG. 9 is a cross-sectional view illustrating electrodes in a subpixel of the display device of FIG. 1 and a plurality of transistors connected to the electrodes.
Figure 10:
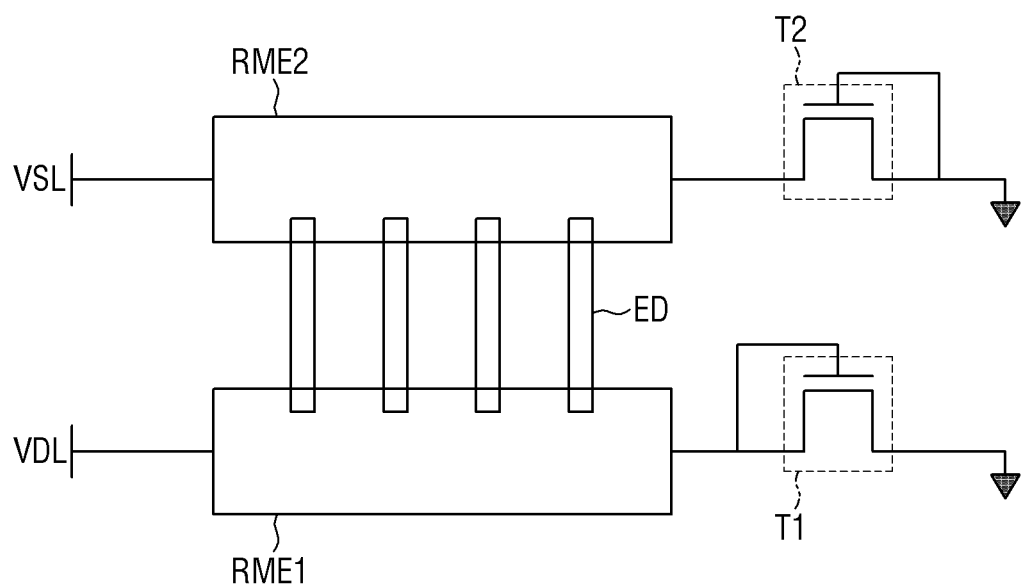
FIG. 10 is a schematic view illustrating an example of how the electrodes and the transistors of FIG. 9 are connected.

FIG. 9 is a cross-sectional view illustrating electrodes in a subpixel of the display device of FIG. 1 and a plurality of transistors connected to the electrodes. FIG. 10 is a schematic view illustrating an example of how the electrodes and the transistors of FIG. 9 are connected.

Referring to FIGS. 9 and 10, the display device 10 may include, in a subpixel SPXn, electrodes RME, i.e., first and second electrodes RME1 and RME2, and a plurality of transistors connected to the electrodes RME, i.e., first and second transistors T1 and T2 that are electrically connected to the first and second electrodes RME1 and RME2, respectively.

The first transistor T1 includes a first active layer ACT1, a first gate electrode G1, a first source electrode S1, and a first drain electrode D1. The second transistor T2 includes a second active layer ACT2, a second gate electrode G2, a second source electrode S2, and a second drain electrode D2. The first and second active layers ACT1 and ACT2, like an active layer ACT_DT of a driving transistor DT, are disposed on a buffer layer BI. The first and second gate electrodes G1 and G2 may be formed of the second conductive layer disposed on the first gate insulating layer GI, and the first and second source electrodes S1 and S2 and the first and second drain electrodes D1 and D2 may be formed of the third conductive layer disposed on the first interlayer insulating layer IL1. That is, the first and second transistors T1 and T2 may be disposed in the same layer as the driving transistor DT.

The first electrode RME1 may be connected to one end of the first transistor T1, and the second electrode RME2 may be connected to one end of the second transistor T2. The first and second electrodes RME1 and RME2 may be directly or electrically connected to the first and second transistors T1 and T2, respectively. In one example, the first electrode RME1 may be directly connected to the first drain electrode D1 of the first transistor T1 through a contact hole that penetrates the via layer VIA, and the second electrode RME2 may be directly connected to the second drain electrode D2 of the second transistor T2 through a contact hole that penetrates the via layer VIA. However, the present disclosure is not limited to this example. In another example, the first and second electrodes RME1 and RME2 may be connected electrically, but not directly, to the first and second transistors T1 and T2, respectively, via another element such as, for example, a capacitor or may be connected to the first and second source electrodes S1 and S2, respectively, rather than to the first and second drain electrodes D1 and D2, respectively.

The term "connect", as used herein, not only means that one element is coupled to another element through physical contact, but also means that one element is coupled to another element via yet another element. One integral member may be understood as having parts connected to one another. Also, the connection between two elements may encompass not only a direct connection between the two elements, but also an electrical connection between the two elements.

The first and second transistors T1 and T2 may be connected to the first and second electrodes RME1 and RME2, respectively, and may thus allow static electricity generated on the electrodes RME to flow in one direction. When static electricity is generated on the electrodes RME, light-emitting layers 36 of light-emitting elements ED may be damaged, or the light-emitting elements ED may not be able to be properly aligned due to the static electricity. The first and second transistors T1 and T2 may allow the static electricity to flow in one direction and may thus prevent the light-emitting elements ED from being damaged by the static electricity.

The direction in which the first transistor T1 and the first electrode RME1 are connected may be opposite to the direction in which the second transistor T2 and the second electrode RME2 are connected, and the direction in which static electricity generated in the first electrode RME1 flows may also be opposite to the direction in which static electricity generated in the second electrode RME2 flows. In one example, the first transistor T1 may be forward-biased to the first electrode RME1, and the second transistor T2 may be reverse-biased to the second electrode RME2. The static electricity generated in the first electrode RME1 may flow in a direction toward the first transistor T1, which is forward-biased to the first electrode RME1, and the static electricity generated in the second electrode RME2 may flow in a direction away from the second transistor T2, which is reverse-biased to the second electrode RME2. As the first and second electrodes RME1 and RME2 are electrically connected to first and second voltage lines VDL and VSL, respectively, electrostatic currents that flow in opposite directions may be generated between the first and second transistors T1 and T2 and the first and second voltage lines VDL and VSL. The electrostatic currents may cause a difference in electric potential, and as a result, an electrostatic field may be generated between the electrodes RME. The electrostatic field may be used in the initial alignment of the light-emitting elements ED. This will be described later in detail.

In one example, first ends (e.g., drain electrodes D1 and D2) of the first and second transistors T1 and T2 may be connected to the electrodes RME, second ends (e.g., source electrodes S1 and S2) of the first and second transistors T1 and T2 may be grounded, and the first and second gate electrodes G1 and G2 of the first and second transistors T1 and T2 may be connected to the first or second ends of the first and second transistors T1 and T2 for forward or reverse bias connections. That is, the first and second gate electrodes G1 and G2 may be equipotential with the first or second ends of the first and second transistors T1 and T2, which are either connected to the first and second electrodes RME1 and RME2 or grounded, and a forward or reverse bias may be determined depending on which of the first and second electrodes RME1 and RME2, the first and second transistors T1 and T2 are each connected to.

In one example, the first end (e.g., the first drain electrode D1) of the first transistor T1 may be connected to the first electrode RME1, the second end (e.g., the first source electrode S1) of the first transistor T1 may be grounded, and the first gate electrode G1 of the first transistor T1 may be forward-biased by being connected to the first end (e.g., the first drain electrode D1) of the first transistor T1. In one example, the first end (e.g., the second drain electrode D2) of the second transistor T2 may be connected to the second electrode RME2, the second end (e.g., the second source electrode S2) of the second transistor T2 may be grounded, and the second gate electrode G2 of the second transistor T2 may be reverse-biased by being connected to the second end (e.g., the second source electrode S2) of the second transistor T2. In a case where the first end of the first transistor T1, which is connected to the first electrode RME1, is the first drain electrode D1, the first gate electrode G1 may be turned on by being connected to the first drain electrode D1. In a case where the first end of the second transistor T2, which is connected to the second electrode RME2, is the second drain electrode D2, the second gate electrode G2 may be turned off by being connected to the second source electrode S2, which is grounded.

During the fabrication of the display device 10, when ink is ejected onto the electrodes RME, static electricity generated on the first electrode RME1 may flow toward the first source electrode S1 of the first transistor T1 due to the first transistor T1 in an on state being forward-biased to the first electrode RME1, and static electricity generated on the second electrode RME2 may flow toward the second voltage line VSL due to the second transistor T2 in an off state being reverse-biased to the second electrode RME2. By flowing static electricity generated by ink ejected onto the electrodes RME in one direction via the first and second transistors T1 and T2, the light-emitting elements ED can be prevented from being damaged by the static electricity.

The first and second transistors T1 and T2 may be not related to or included in a driving circuit included in the corresponding subpixel SPXn of the display device 10. During the driving of the display device 10, the driving transistor DT and first and second switching transistors ST1 and ST2 may be driven, as illustrated in FIG. 3. As will be described later, the properties and the sizes of the first and second transistors T1 and T2 may be controlled such that the first and second transistors T1 and T2 may be able to properly configure forward or reverse bias connections to allow static electricity generated during the fabrication of the display device 10 to flow in one direction, but not to affect the operation of the driving circuit. That is, the first and second transistors T1 and T2 may have a size sufficient to control electricity generated during the fabrication of the display device 10 without affecting the operation of the driving circuit.

The first and second transistors T1 and T2 are illustrated, but not limited to, being n-type transistors, and the first and second drain electrodes D1 and D2 are illustrated as, but not limited to, being connected to the first ends of the first and second electrodes RME1 and RME2, respectively. Alternatively, the first and second transistors T1 and T2 may be p-type transistors depending on the material of the active layer of the display device 10, in which case, the first and second source electrodes S1 and S2 may be connected to the first ends of the electrodes RME.

Figure 11:
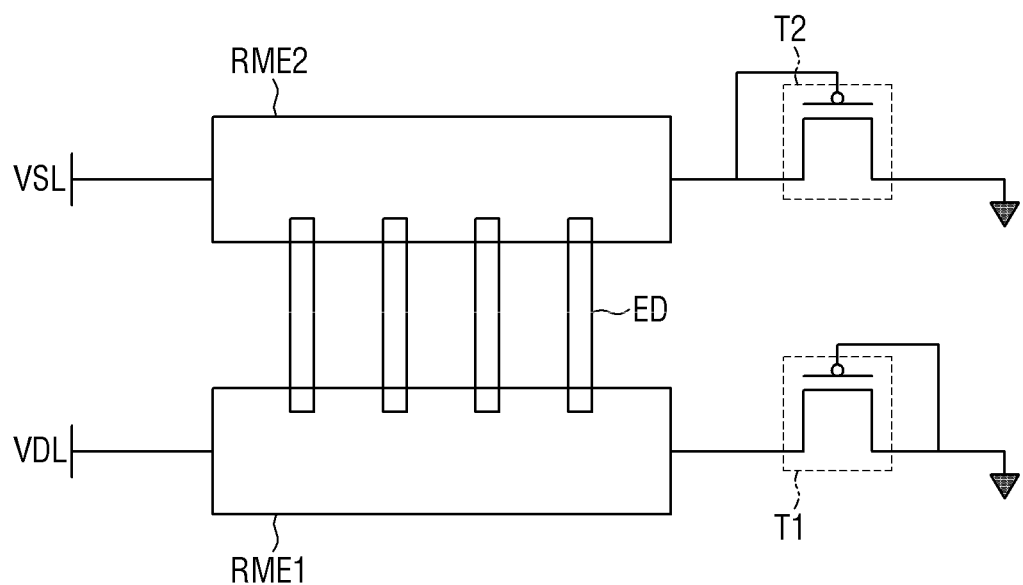
FIG. 11 is a schematic view illustrating an example of how the electrodes and the transistors of FIG. 9 are connected.

FIG. 11 is a schematic view illustrating another example of how the electrodes and the transistors of FIG. 9 are connected.

Referring to FIG. 11, the first and second transistors T1 and T2 may be p-type transistors, the first and second source electrodes S1 and S2 of the first and second transistors T1 and T2 may be connected to the electrodes RME, and the first and second drain electrodes D1 and D2 of the first and second transistors T1 and T2 may be grounded. In a case where the active layer of the display device 10 is formed as a p-type semiconductor layer, the first and second transistors T1 and T2 may be p-type transistors, and the embodiment of FIG. 11 may be opposite to the embodiment of FIG. 10 in terms of which electrodes of the first and second transistors T1 and T2 are connected to the electrodes RME and which electrodes of the first and second transistors T1 and T2 are grounded. The first gate electrode G1 of the first transistor T1 may be connected to the first drain electrode D1 of the first transistor T1 and thereby grounded such that the first transistor T1 may be forward-biased to the first electrode RME1, and the second gate electrode G2 of the second transistor T2 may be connected to the second source electrode S2 of the second transistor T2 such that the second transistor T2 may be reverse-biased to the second electrode RME2.

Although not specifically illustrated, as the first and second transistors T1 and T2 are p-type transistors, the driving transistor DT and the first and second switching transistors ST1 and ST2 may also be p-type transistors.

A method of fabricating the display device 10 will hereinafter be described.

FIGS. 12-17 are schematic views illustrating steps of a method of fabricating a display device according to an embodiment of the disclosure. FIGS. 12-17 illustrate how light-emitting elements ED are aligned by electric fields EC1 and EC2 generated between electrodes RME during the fabrication of the display device 10.

Referring to FIGS. 12-17, the method of fabricating the display device 10 may include: a step of forming a first electrode RME1, which is electrically connected to a first transistor T1 and a first voltage line VDL, and a second electrode RME2, which is electrically connected to a second transistor T2 and a second voltage line VSL, on the first substrate SUB; a step of spraying ink having light-emitting elements ED dispersed therein on the first and second electrodes RME1 and RME2; a first alignment step of generating a first electric field EC1 with static electricity that flows in the first electrode RME1 and the first transistor T1 and static electricity that flows in the second electrode RME2 and the second transistor T2 and thereby aligning the light-emitting elements ED with the first electric field EC1; and a second alignment step of generating a second electric field EC2 on the first and second electrodes RME1 and RME2 by applying first and second alignment voltages V1 and V2 to the first and second electrodes RME1 and RME2, respectively, and thereby aligning the light-emitting elements ED with the second electric field EC2.

Figure 12:
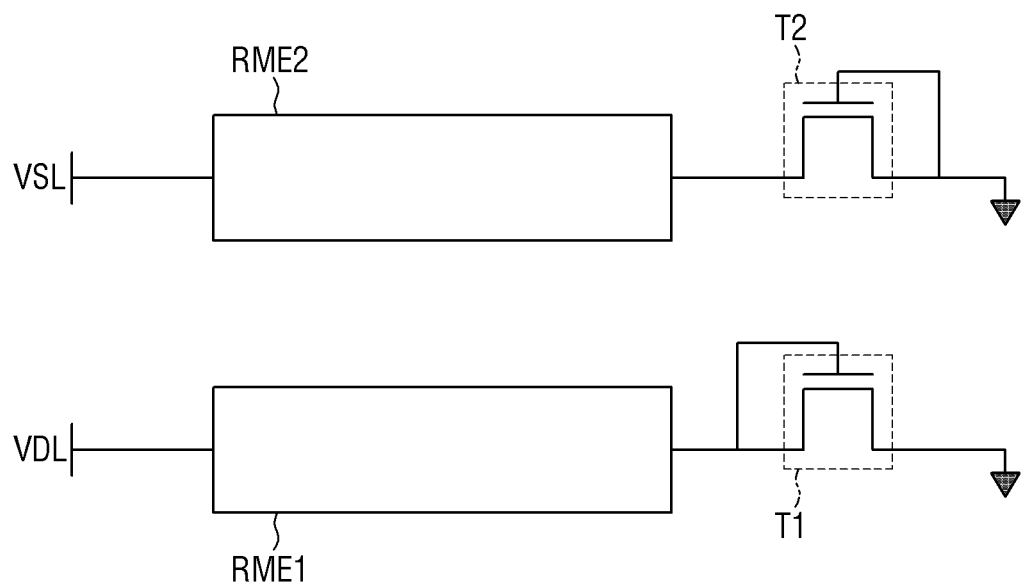
FIGS. 12-17 are schematic views illustrating steps of a method of fabricating a display device according to an embodiment of the present disclosure.

First, referring to FIG. 12, the first and second electrodes RME1 and RME2, which are connected to the first and second transistors T1 and T2, respectively, are formed. The arrangement of the first and second electrodes RME1 and RME2 and the first and second transistors T1 and T2 is the same as described above with reference to FIGS. 4-10. The first transistor T1 may be forward-biased to the first electrode RME1, and the second transistor T2 may be reverse-biased to the second electrode RME2. The first and second electrodes RME1 and RME2 may be connected to the first and second voltage lines VDL and VSL, respectively. The first and second voltage lines VDL and VSL may be used to apply the first and second alignment voltages V1 and V2, respectively, during the alignment of the light-emitting elements ED.

Figure 13:
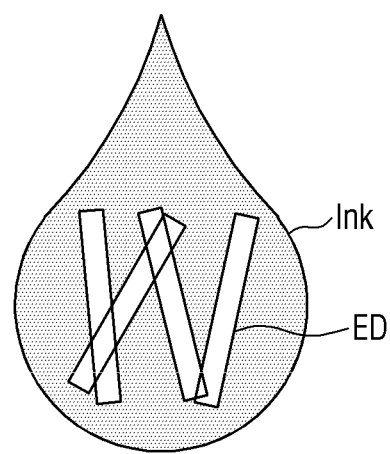
Figure 13:
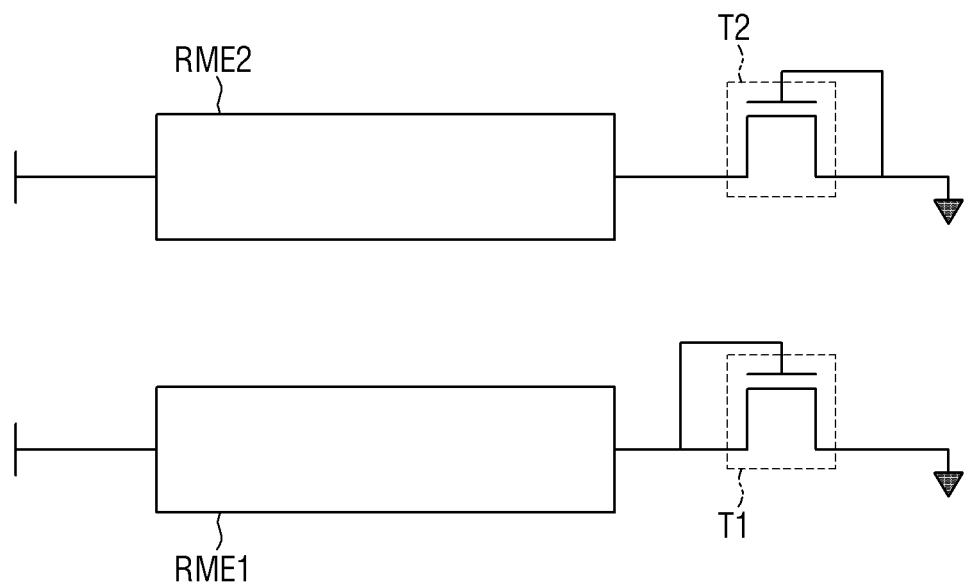
Figure 14:
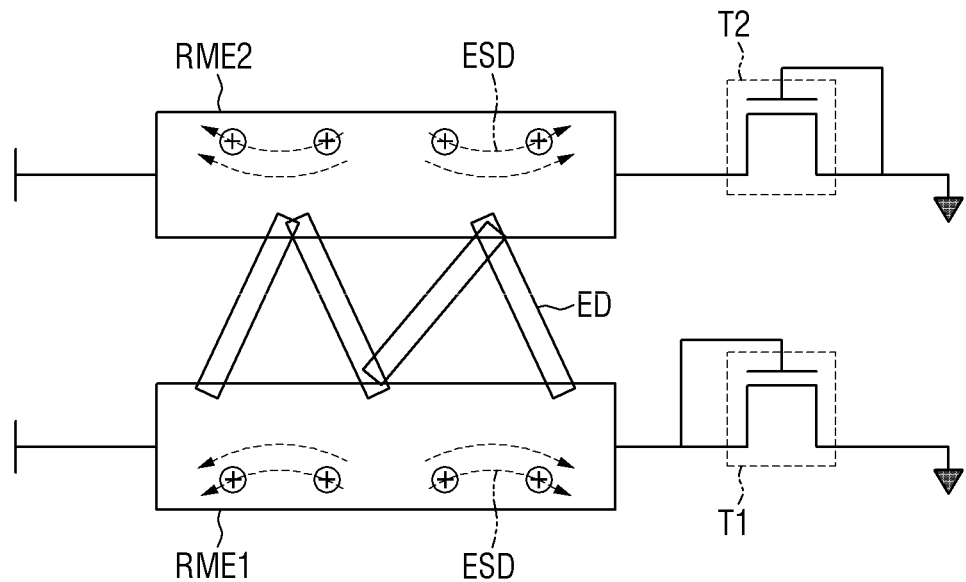

Thereafter, referring to FIGS. 13 and 14, the light-emitting elements ED are sprayed onto the electrodes RME. In one example, the light-emitting elements ED may be prepared in a state of being dispersed in ink "Ink" and may be sprayed onto the electrodes RME. As the light-emitting elements ED receive a force from the first and second electric fields EC1 and EC2 generated between the electrodes RME, the alignment direction and the location of the light-emitting elements ED may change, and as a result, the light-emitting elements ED may be aligned on the electrodes RME.

The electrodes RME may be electrically connected to the first and second voltage lines VDL and VSL of a circuit layer CCL below the via layer VIA and to the first and second transistors T1 and T2, and when the ink "Ink" is sprayed onto the electrodes RME, static electricity ESD may be generated due to the surface friction between the electrodes RME and the ink "Ink". If the light-emitting elements ED are aligned with the static electricity ESD yet to be removed, some of the light-emitting elements ED may be fixed on the electrodes RME, or the light-emitting layers 36 of the light-emitting elements ED may be damaged, due to the static electricity ESD. That is, the static electricity ESD may affect the alignment of the light-emitting elements ED and the emission properties of the light-emitting elements ED. However, as described above, as the display device 10 includes the electrodes RME and the first and second transistors T1 and T2, which are connected to the electrodes RME, the display device 10 includes a circuit (e.g., a virtual circuit) capable of removing the static electricity ESD generated on the electrodes RME. As a result, the static electricity generated due to the surface friction between the ink "Ink" and the electrodes RME may flow in one direction due to the circuit (e.g., virtual circuit) including the first and second transistors T1 and T2, and as a result, damage to the light-emitting elements ED can be prevented or reduced.

Also, as described above, as the first and second transistors T1 and T2 are forward- or reverse-biased to the electrodes RME, the direction in which the static electricity ESD generated on the first electrode RME1 flows may be opposite to the direction in which the static electricity ESD generated on the second electrode RME2 flows. Accordingly, a difference in electric potential may be generated due to currents of the static electricity ESD that flow in the first and second electrodes RME1 and RME2, and as a result, an electric field may be generated between the electrodes RME.

Figure 15:
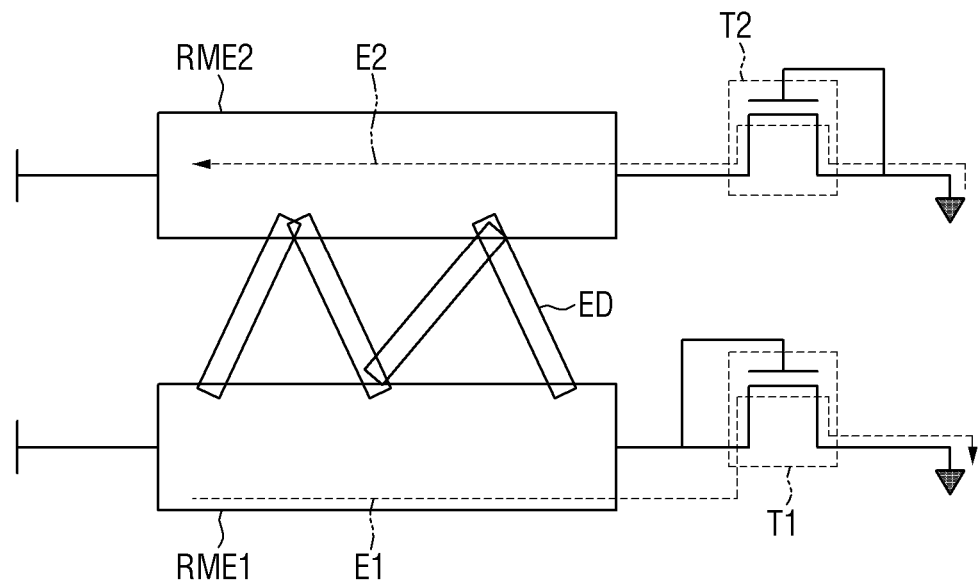
Figure 16:
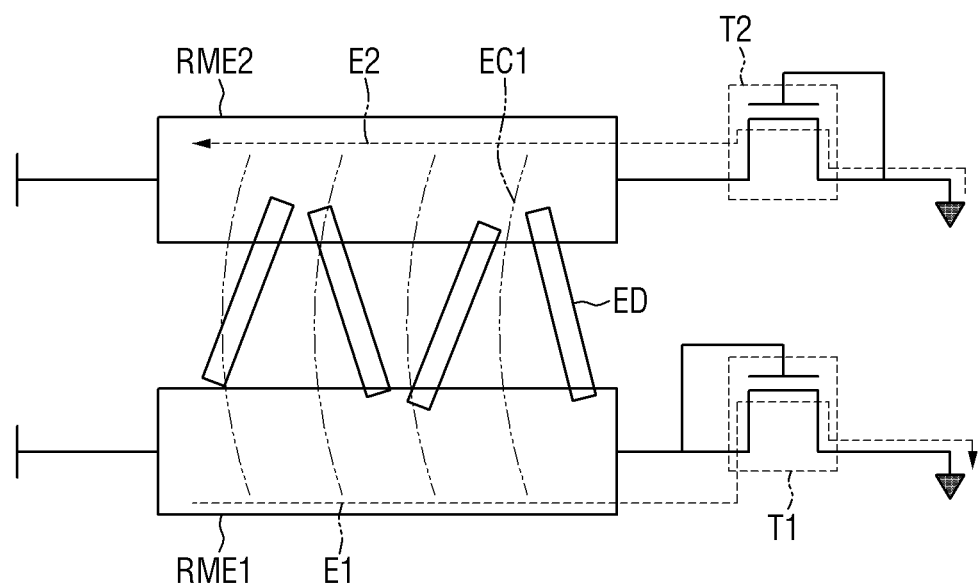

As illustrated in FIGS. 15 and 16, a first electrostatic current E1, which is to flow to the first transistor T1 that is forward-biased to the first electrode RME1, may flow in the first electrode RME1, and a second electrostatic current E2, which is to flow to the second transistor T2 that is reverse-biased to the second electrode RME2, may flow in the second electrode RME2. As the first and second static electricities E1 and E2 differ from each other, a difference in electric potential may arise between the first and second static electricities E1 and E2. As a result, a first electric field EC1 may be generated in the ink "Ink" on the first and second electrodes RME1 and RME2 due to the difference in electric potential between the first and second static electricities E1 and E2.

As both end portions of each of the light-emitting elements ED where a first or second semiconductor layer 31 or 32 is disposed has different polarities, the light-emitting elements ED may have a dipole moment. The light-emitting elements ED may receive a force from the first electric field EC1 in accordance with the direction of the dipole moment of the light-emitting elements ED, while being in a state of being dispersed in the ink "Ink", and the light-emitting elements ED may be aligned such that both end portions of each of the light-emitting elements ED may be seated on the first or second electrode RME1 or RME2. However, as the first electric field EC1 is relatively weak, the alignment of the light-emitting elements ED by the first electric field EC1, i.e., the first alignment step, may be a step of preliminary aligning the first light-emitting elements ED. The first alignment step may be a step of preventing the light-emitting elements ED from being fixed on the electrodes RME and removing the static electricity ESD to prevent or reduce damage to the light-emitting elements ED.

Figure 17:
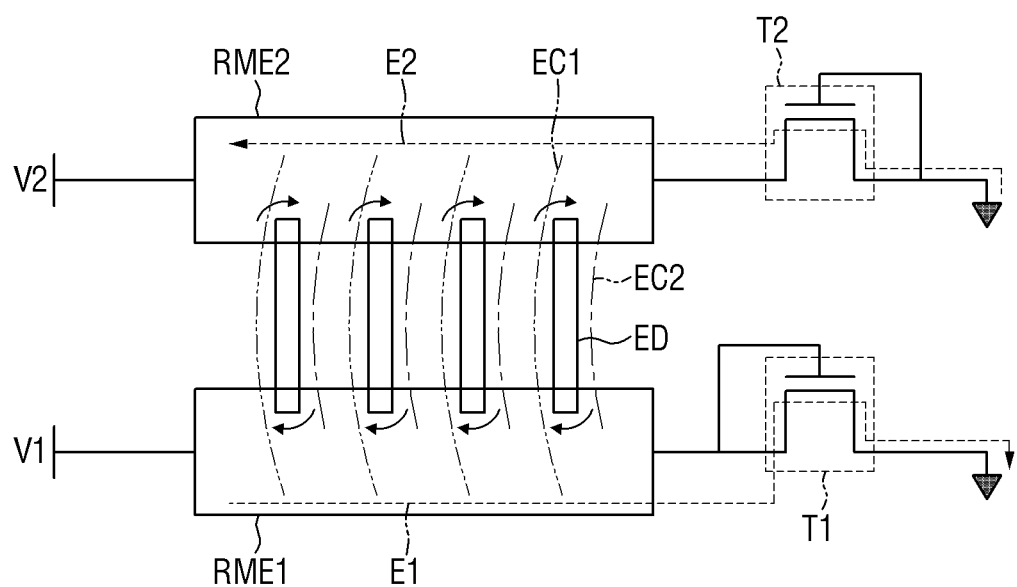

Thereafter, as illustrated in FIG. 17, the light-emitting elements ED are aligned by a second electric field EC2, which is generated by applying the first and second alignment voltages V1 and V2 to the first and second electrodes RME1 and RME2, respectively. The first and second electrodes RME1 and RME2 may receive the first and second alignment voltages V1 and V2, respectively, via the first and second voltage lines VDL and VSL, respectively. The first and second alignment voltages V1 and V2 may generate the second electric field EC2 due to the difference in electric potential therebetween, and the light-emitting elements ED may be aligned on the electrodes RME by receiving a force from the second electric field EC2. In one example, in the second alignment step, the first alignment voltage V1, which is applied to the first electrode RME1, may be an alternating current (AC) voltage, and the second alignment voltage V2, which is applied to the second electrode RME2, may be a ground voltage. The light-emitting elements ED may have a dipole moment and may be aligned such that particular end portions of the light-emitting elements ED may be oriented in a particular direction due to the second electric field EC2, which is generated by the first and second alignment voltages V1 and V2. In one example, the light-emitting elements ED may be aligned such that the first end portions and the second end portions of the light-emitting elements ED may be placed on the first and second electrodes RME1 and RME2, respectively.

Thereafter, although not specifically illustrated, the display device 10 may be obtained by drying the ink "Ink" and then forming insulating layers and connecting electrodes CNE on the light-emitting elements ED.

As the display device 10 includes a circuit (e.g., a virtual circuit) consisting of the first and second transistors T1 and T2, which are connected to the electrodes RME, the static electricity ESD generated by the surface friction between the ink "Ink" and the electrodes RME when the ink "Ink" is being sprayed, can be removed. Also, the first and second electrostatic currents E1 and E2 may flow in the circuit (e.g., the virtual circuit), which is connected to the electrodes RME, and as a result, the light-emitting elements ED may be preliminarily aligned by, for example, the first electric field EC1. The display device 10 can prevent or reduce the light-emitting elements ED from being damaged by the static electricity ESD and can improve the degree of alignment of the light-emitting elements ED by preliminary aligning the light-emitting elements ED with the first and second electrostatic currents E1 and E2.

Display devices according to other embodiments of the disclosure will hereinafter be described.

Figure 18:
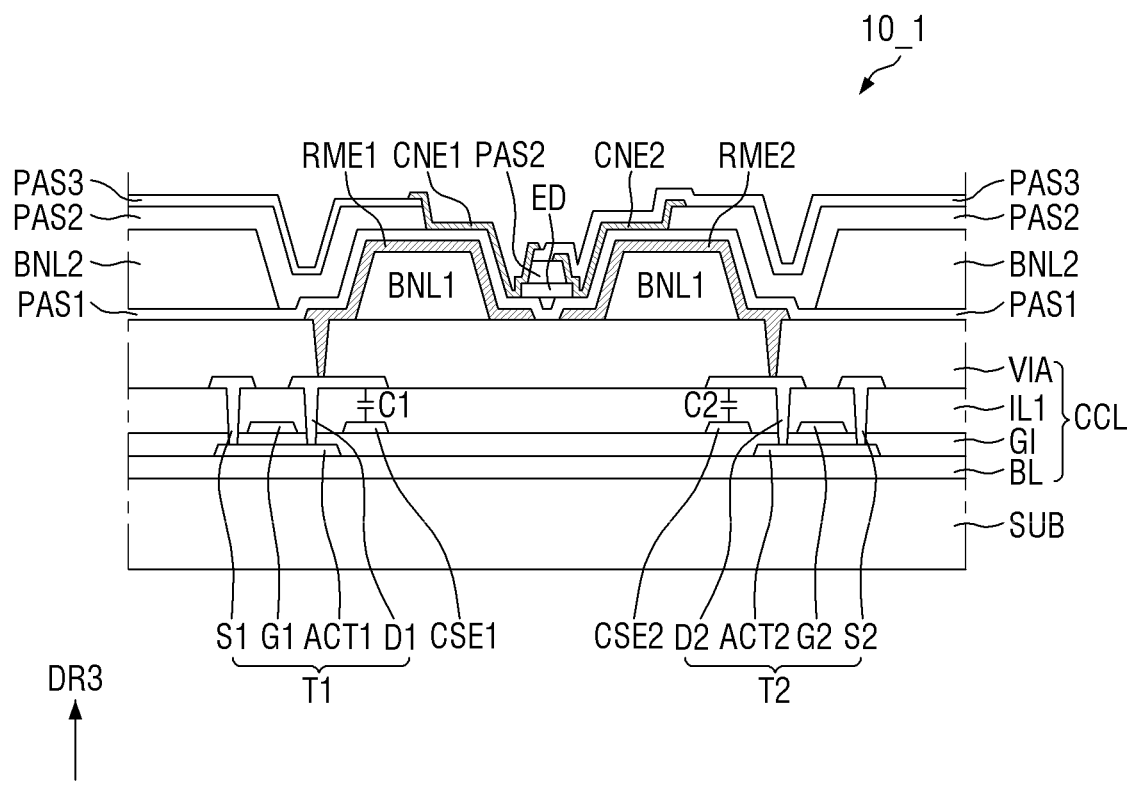
FIG. 18 is a cross-sectional view illustrating electrodes in a subpixel of a display device according to an embodiment of the present disclosure and a plurality of transistors connected to the electrodes.
Figure 19:
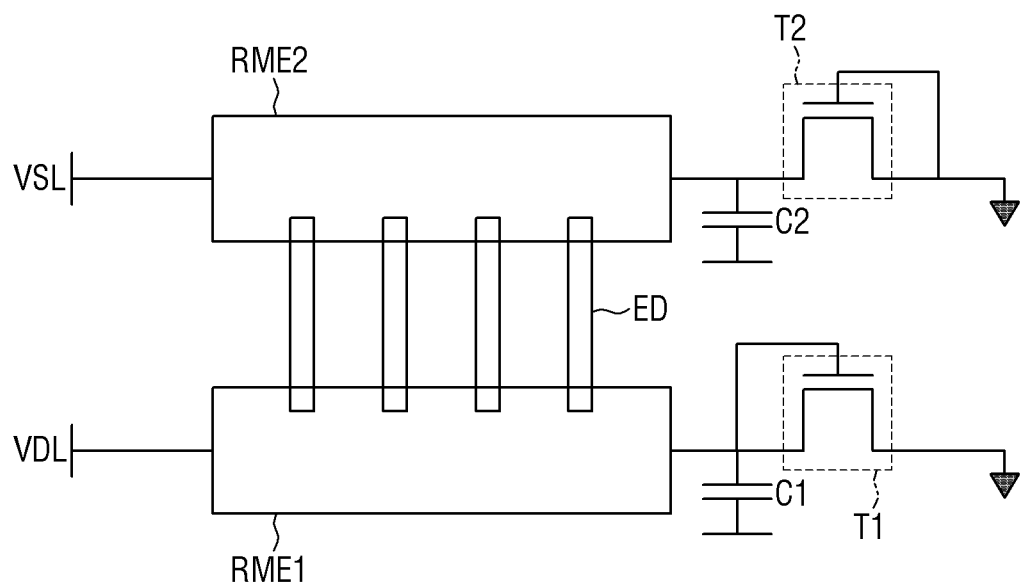
FIG. 19 is a schematic view illustrating an example of how the electrodes and the transistors of FIG. 18 are connected.

FIG. 18 is a cross-sectional view illustrating electrodes in a subpixel of a display device according to an embodiment of the present disclosure and a plurality of transistors connected to the electrodes. FIG. 19 is a schematic view illustrating an example of how the electrodes and the transistors of FIG. 18 are connected.

Referring to FIGS. 18 and 19, a display device 10_1 may further include, in each subpixel SPXn, a first capacitor C1, which is connected to a node between a first transistor T1 and a first electrode RME1, and a second capacitor C2, which is connected to a node between a second transistor T2 and a second electrode RME2. The display device 10_1 may further include first and second capacitive electrodes CSE1 and CSE2, which are formed of a second conductive layer, and the first and second capacitive electrodes CSE1 and CSE2 may form the first and second capacitors C1 and C2, respectively, with first ends (e.g., first and second drain electrodes D1 and D2) of the first and second transistors T1 and T2, respectively.

In one example, the first capacitive electrode CSE1 may be spaced from a first drain electrode D1 of the first transistor T1 by a first interlayer insulating layer IL1. The first capacitor C1 may be generated between the first drain electrode D1 and the first capacitive electrode CSE1. In one example, the second capacitive electrode CSE2 may be spaced from a second drain electrode D2 of the second transistor T2 by the first interlayer insulating layer IL1. The second capacitor C2 may be generated between the second drain electrode D2 and the second capacitive electrode CSE2. A circuit (e.g., a virtual circuit) for removing static electricity ESD may consist not only of the first and second transistors T1 and T2, but also of the first and second capacitors C1 and C2. The first capacitor C1, which is connected to a node between a first transistor T1 and a first electrode RME1, and a second capacitor C2, which is connected to a node between a second transistor T2 and a second electrode RME2, may store static electricity generated on the electrodes RME in accordance with the direction in which the first and second transistors T1 and T2 are biased to the first and second electrodes RME1 and RME2, respectively, (for example, whether the first and second transistors T1 and T2 are forward- or reverse-biased to the first and second electrodes RME1 and RME2, respectively).

Light-emitting elements ED may be aligned between the first and second electrodes RME1 and RME2 by controlling the static electricity generated on the electrodes RME, with the use of the first and second capacitors C1 and C2 and the first and second transistors T1 and T2, and controlling first and second alignment voltages V1 and V2 applied from first and second voltage lines VDL and VSL, respectively.

Figure 20:
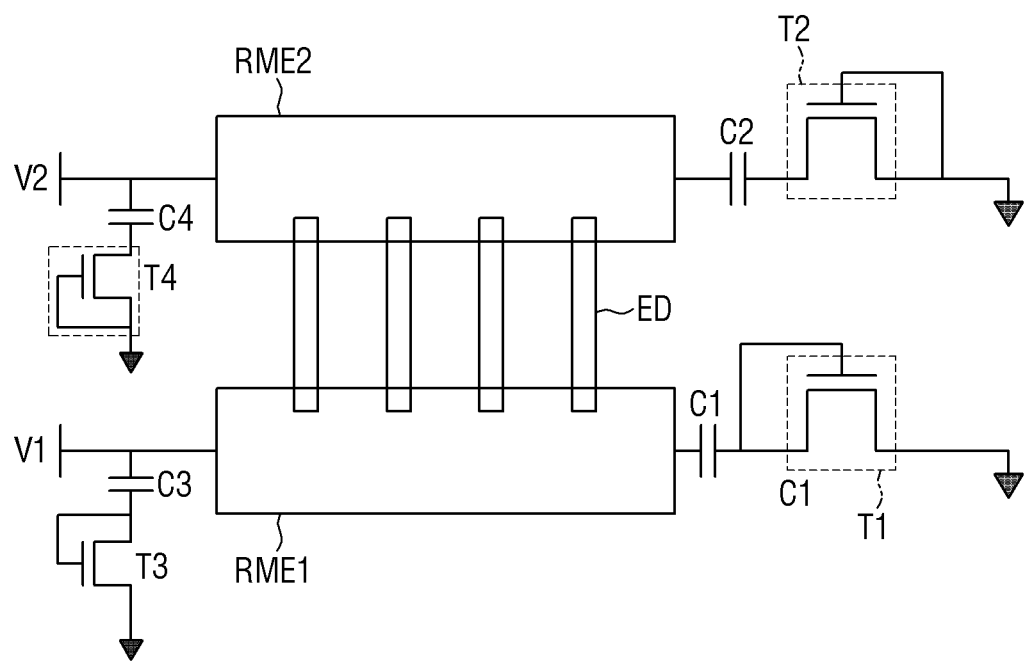
FIGS. 20 and 21 are schematic views illustrating examples of how the electrodes and the transistors of a display device according to an embodiment of the present disclosure are connected.
Figure 21:
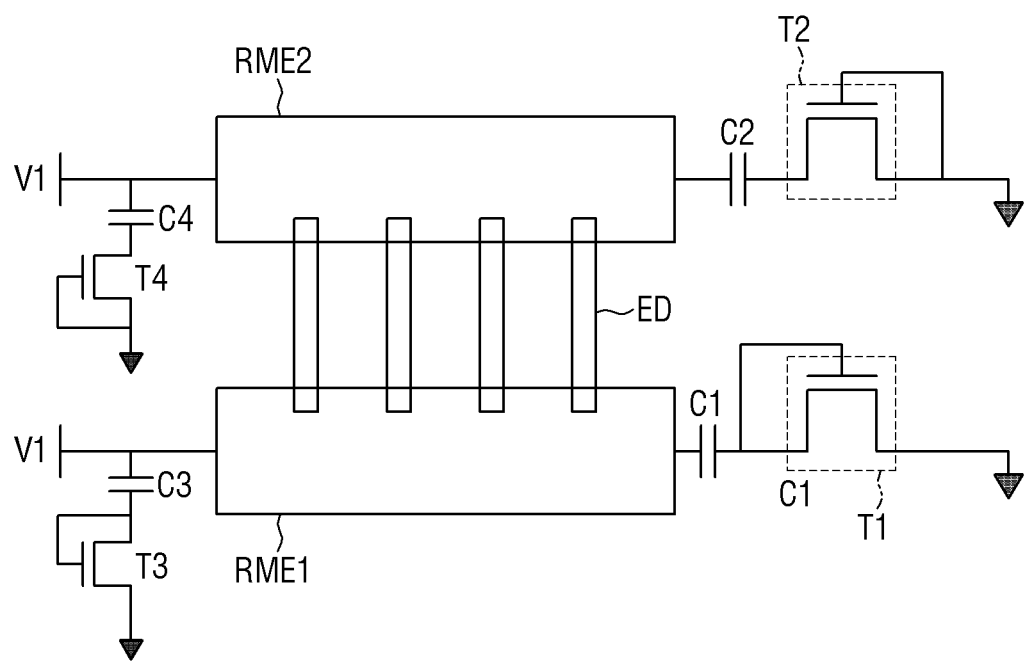

FIGS. 20 and 21 are schematic views illustrating examples of how the electrodes and the transistors of a display device according to an embodiment of the present disclosure are connected.

Referring to FIGS. 20 and 21, a display device 10 may include, in each subpixel SPXn, first and second transistors T1 and T2, which are connected to first and second electrodes RME1 and RME2, respectively, and third and fourth transistors T3 and T4, which are connected between the electrodes RME and first and second voltage lines VDL and VSL. A first capacitor C1 may be connected between the first electrode RME1 and the first transistor T1, and a third capacitor C3 may be connected between the first electrode RME1 and the third transistor T3. A second capacitor C2 may be connected between the second electrode RME2 and the second transistor T2, and a fourth capacitor C4 may be connected between the second electrode RME2 and the fourth transistor T4.

In the embodiment of FIGS. 20 and 21, unlike in the embodiment of FIG. 19, a first electrode of the first capacitor C1 may be connected to the first electrode RME1, and a second electrode of the first capacitor C1 may be connected to a first end (e.g., the first drain electrode D1) of the first transistor T1. Also, in the embodiment of FIGS. 20 and 21, unlike in the embodiment of FIG. 19, a first electrode of the second capacitor C2 may be connected to the second electrode RME2, and a second electrode of the second capacitor C2 may be connected to a first end (e.g., the second drain electrode D2) of the second transistor T2.

A first end of the third transistor T3 may be connected to the first electrode RME1 through the third capacitor C3, a second end of the third transistor T3 may be grounded, and the gate electrode of the third transistor T3 may be connected to the first end (e.g., a drain electrode) of the third transistor T3, which is connected to the first electrode RME1. A first end of the fourth transistor T4 may be connected to the second electrode RME2 through the fourth capacitor C4, a second end of the fourth transistor T4 may be grounded, and the gate electrode of the fourth transistor T4 may be connected to the second end (e.g., a source electrode) of the fourth transistor T4, which is grounded. A first electrode of the third capacitor C3 may be connected to the first electrode RME1 and the first voltage line VDL, to which a first alignment voltage V1 is applied, and a second electrode of the third capacitor C3 may be connected to the first end (e.g., a drain electrode) of the third transistor T3. A first electrode of the fourth capacitor C4 may be connected to the second electrode RME2 and the second voltage line VSL, to which a second alignment voltage V2 is applied, and a second electrode of the fourth capacitor C4 may be connected to the first end (e.g., a drain electrode) of the fourth transistor T4.

If during the fabrication of the display device 10, ink is sprayed onto the first and second electrodes RME and static electricity is generated, the static electricity may flow in one direction in accordance with the direction in which the first and second transistors T1 and T2 are biased. The static electricity generated on the first electrode RME1 may be removed by being stored in the first capacitor C1 due to the first transistor T1 being forward-biased to the first electrode RME1, and the static electricity generated on the second electrode RME2 may be released from the second electrode RME2 due to the second transistor T2 being reverse-biased to the second electrode RME2. Here, a first electric field EC1 may be generated in accordance with the directions of the static electricities generated on the first and second electrodes RME1 and RME2, and the light-emitting elements ED can be preliminarily aligned.

In a case where the first transistor T1 is reverse-biased to the first electrode RME1 and the second transistor T2 is forward-biased to the second electrode RME2, the static electricity generated on the first electrode RME1 may be released, and the static electricity generated on the second electrode RME2 may be stored in the second capacitor C2 by the second transistor T2. Even in this case, the light-emitting elements ED can be preliminarily aligned.

The first and second alignment voltages V1 and V2, which are applied from the first and second voltage lines VDL and VSL, respectively, may be stored in the third and fourth capacitors C3 and C4, respectively, and may be released into the first and second electrodes RME1 and RME2, respectively, in accordance with the direction in which the third and fourth transistors T3 and T4 are biased. The first alignment voltage V1 from the first voltage line VDL may be stored in the third capacitor C3 and may be released into the first electrode RME1 due to the third transistor T3 being forward-biased to the first electrode RME1. The second alignment voltage V2 from the second voltage line VSL may be stored in the fourth capacitor C4 and may be released into the second electrode RME2 due to the fourth transistor T4 being reverse-biased to the second electrode RME2. As the first and second alignment voltages V1 and V2 are stored in the third and fourth capacitors C3 and C4, respectively, and are then released into the first and second electrodes RME1 and RME2, the first and second alignment voltages V1 and V2 may be transformed into direct current (DC) voltages.

In this case, the voltages stored in the third and fourth capacitors C3 and C4 may be transformed into DC voltages and may be released into the first and second electrodes RME1 and RME2 depending on the direction in which the third and fourth transistors T3 and T4 are biased. That is, even if the same voltage is applied to the first and second voltage lines VDL and VSL, the electrodes into which the voltages stored in the third and fourth capacitors C3 and C4 may be released may vary depending on the direction in which the third and fourth transistors T3 and T4 are biased, and as a result, an electric field may be generated.

The same voltage, for example, the first alignment voltage V1, may be applied to both the first and second voltage lines VDL and VSL, which are connected to the first and second electrodes RME1 and RME2, and may be stored in both the third and fourth capacitors C3 and C4. If the third transistor T3 is forward-biased to the first electrode RME1 and the fourth transistor T4 is reverse-biased to the second electrode RME2, a DC alignment voltage may be applied to the first electrode RME1, and an alignment voltage having the opposite sign to the DC alignment voltage may be applied to the second electrode RME2. On the contrary, if the third transistor T3 is reverse-biased to the first electrode RME1 and the fourth transistor T4 is forward-biased to the second electrode RME2, a DC alignment voltage may be applied to the second electrode RME2, and an alignment voltage having the opposite sign to the DC alignment voltage may be applied to the first electrode RME1. As a result, a second electric field EC2 may be generated between the first and second electrodes RME1 and RME2 so that the light-emitting elements ED may be aligned.

Figure 22:
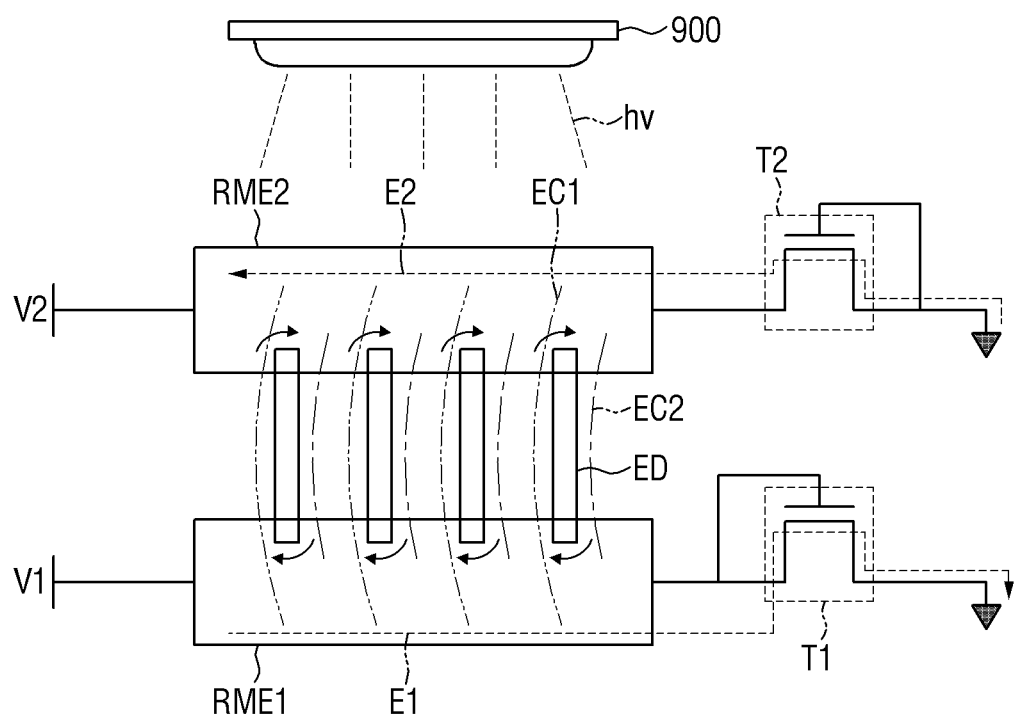
FIG. 22 is a schematic view illustrating a step of a method of fabricating a display device according to an embodiment of the present disclosure.

FIG. 22 is a schematic view illustrating a step of a method of fabricating a display device according to an embodiment of the present disclosure.

Referring to FIG. 22, in a second alignment step of the method where light-emitting elements ED are aligned by applying first and second alignment voltages V1 and V2 to first and second electrodes RME1 and RME2, respectively, may further include a step of applying light hv to the light-emitting elements ED. When a second electric field EC2 for aligning the light-emitting elements ED is generated in the second alignment step, the light hv may be applied to the light-emitting elements ED using a light irradiation device 900. As the light-emitting elements ED include light-emitting layers 36, the dipole moment of the light-emitting elements ED may increase in response to exciters being generated by the light hv. Light-emitting elements ED having an increased dipole moment may receive a greater force from the second electric field EC2 and may be aligned such that particular end portions of the light-emitting elements ED may be properly oriented in a particular direction. In the second alignment step, the first and second alignment voltages V1 and V2 may be applied to the first and second electrodes RME1 and RME2, respectively, with the light hv applied to the light-emitting elements ED. As the light-emitting elements ED are aligned by applying the first and second alignment voltages V1 and V2 while applying the light hv, the degree of alignment of the light-emitting elements ED can be further improved.

The display device 10 may be used as a single display device that displays a screen image, but the present disclosure is not limited thereto. In some embodiments, the display device 10 may be connected to other display devices and may thus form a single tiled display device.

Figure 23:
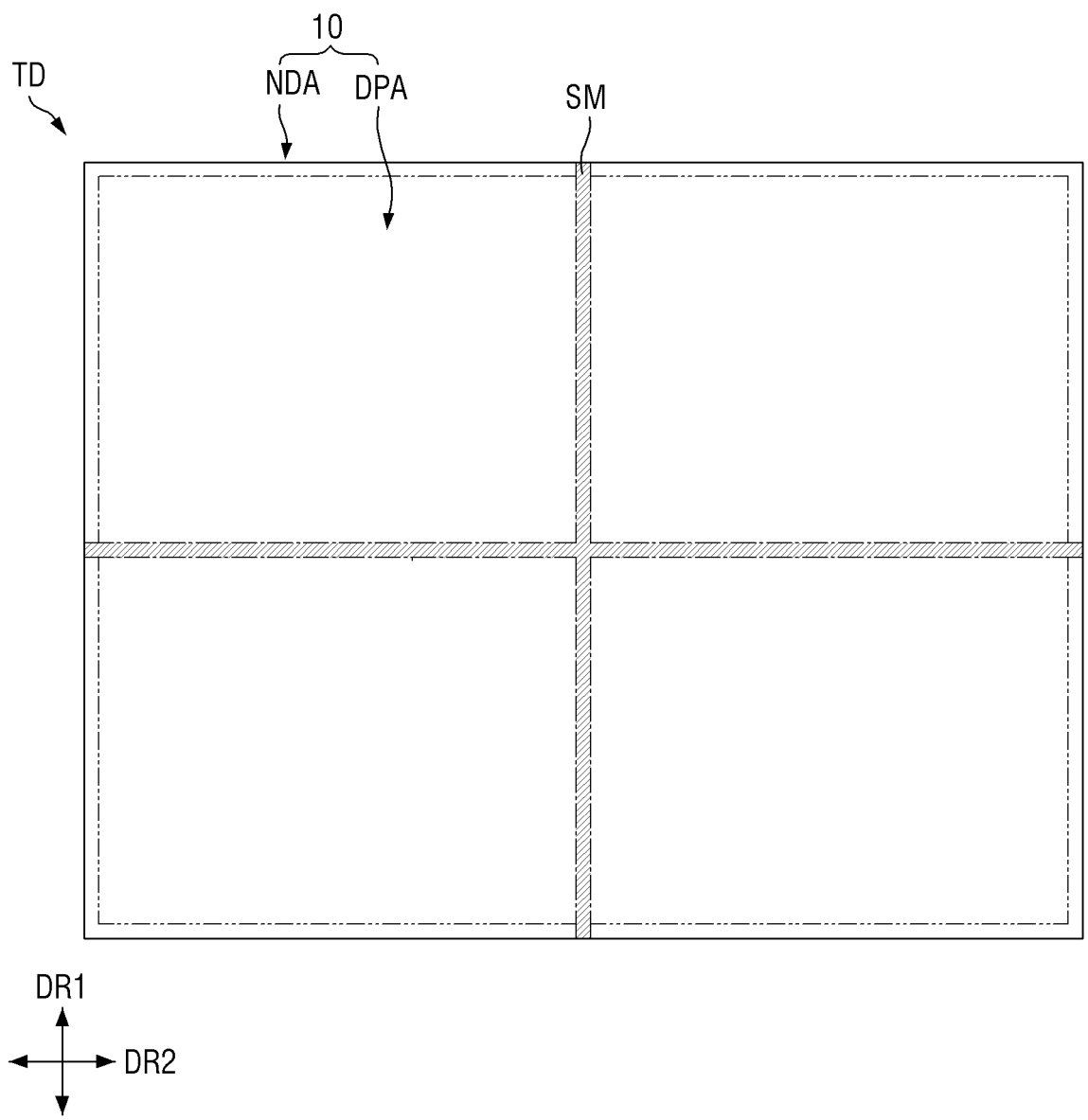
FIG. 23 is a plan view of a tiled display device according to an embodiment of the present disclosure.

FIG. 23 is a plan view of a tiled display device according to an embodiment of the present disclosure.

Referring to FIG. 23, a tiled display device TD may include a plurality of display devices 10. The display devices 10 may be arranged in a lattice pattern, but the present disclosure is not limited thereto. The display devices 10 may be connected in a first direction DR1 and/or a second direction DR2, and the tiled display device TD may have a particular shape. In one example, the display devices 10 may all have the same size, but the present disclosure is not limited thereto. In an example, the display devices 10 may have different sizes.

The tiled display device TD may generally have a flat shape, but the present disclosure is not limited thereto. The tiled display device TD may have a stereoscopic shape and may thus provide a sense of depth to a user. In one example, in a case where the tiled display device TD has a stereoscopic shape, at least some of the display devices 10 may have a curved shape. In another example, the display devices 10 may all have a flat shape and may be connected to one another at a suitable angle (e.g., a predetermined angle) so that the tiled display device TD may have a stereoscopic shape.

The tiled display device TD may include bonding areas SM that are disposed between a plurality of adjacent display areas DPA of the display devices 10. The tiled display device TD may be obtained by connecting non-display areas NDA of the display devices 10. The display devices 10 may be connected to one another via a bonding member or an adhesive member disposed in the bonding areas SM. A pad portion and a flexible film attached to the pad portion may not be included in the bonding areas SM of the display devices 10. Thus, the distance between the display areas DPA of the display devices 10 may be so close that the bonding areas SM of the display devices 10 may become almost invisible to the user. The reflectance of the display areas DPA of the display devices 10 may be substantially the same as the reflectance of the bonding areas SM of the display devices 10. Thus, the tiled display device TD can overcome the sense of discontinuity between the display devices 10 and improve the degree of immersion of an image by preventing the bonding areas SM of the display devices 10 from becoming recognizable to the user.

The display devices 10 may be arranged by connecting the long sides or the short sides of each of the display devices 10. Some of the display devices 10 may be arranged along the edges of the tiled display device TD to form the sides of the tiled display device TD. Some of the display devices 10 may be arranged at the corners of the tiled display device TD to form each pair of adjacent sides of the tiled display device TD. Some of the display devices 10 may be disposed in the middle (or the central portion) of the tiled display device TD and may be surrounded by other display devices 10.

As a single tiled display device TD can be configured by connecting multiple display devices 10, a large-size screen image can be displayed.

In concluding the detailed description, those skilled in the art will appreciate that many variations and modifications can be made to the embodiments without substantially departing from the principles of the present disclosure. Therefore, the embodiments of the present are used in a generic and descriptive sense only and not for purposes of limitation. The embodiments are also defined in the following claims, and equivalents thereof.

What is claimed is:

1. A display device comprising a sub-pixel, the sub-pixel comprising:
   a first substrate;
   a first electrode on the first substrate;
   a second electrode on the first substrate and spaced from the first electrode;

a plurality of light-emitting elements, each of the plurality of light-emitting elements connected between the first electrode and the second electrode and having respective end portions on the first and second electrodes;

a first connecting electrode on the first electrode and connected to one end of a light-emitting element from among the plurality of light-emitting elements;

a second connecting electrode on the second electrode and connected to an other end of the light-emitting element, the first connecting electrode and the second connecting electrode being at different layers;

a first transistor comprising a first first transistor electrode and a first second transistor electrode, the first first transistor electrode being connected to the first electrode and the first second transistor electrode being grounded; and a second transistor comprising a first end connected to the second electrode and a second end grounded, wherein the first transistor is forward-biased to the first electrode, and the second transistor is reverse-biased to the second electrode.

2. The display device of claim 1, further comprising:
a first voltage line and a second voltage line,
wherein the first voltage line is electrically connected to the first electrode, and the second voltage line is electrically connected to the second electrode.

3. The display device of claim 2, wherein:
the first transistor comprises a first drain electrode electrically coupled to the first electrode, a first source electrode grounded, and a first gate electrode electrically coupled to the first drain electrode; and
the second transistor comprises a second drain electrode electrically coupled to the second electrode, a second source electrode grounded, and a second gate electrode electrically coupled to the second source electrode.

4. The display device of claim 2, wherein:
the first transistor comprises a first source electrode electrically coupled to the first electrode, a first drain electrode grounded, and a first gate electrode electrically coupled to the first drain electrode, and
the second transistor comprises a second source electrode electrically coupled to the second electrode, a second drain electrode grounded, and a second gate electrode electrically coupled to the second source electrode.

5. The display device of claim 2, wherein:
each of the light-emitting elements comprises a first semiconductor layer, a second semiconductor layer, and a light-emitting layer between the first semiconductor layer and the second semiconductor layer;
first end portions of the light-emitting elements on the first electrode, wherein the first semiconductor layer is at the first end portion of a respective one of the light-emitting elements; and
second end portions of the light-emitting elements on the second electrode, wherein the second semiconductor layer is at the second end portion of a respective one of the light-emitting elements.

6. The display device of claim 2, further comprising:
a driving transistor connected to the first voltage line and the second voltage line,
wherein the first electrode is connected to the driving transistor, and the second electrode is directly connected to the second voltage line.

7. The display device of claim 6, further comprising:
a via layer between the first substrate and the first electrode and the second electrode,
wherein the first transistor, the second transistor, and the driving transistor are between the via layer and the first substrate.

8. The display device of claim 7, further comprising:
a first conductive layer on the first substrate;
a buffer layer on the first conductive layer;
an active layer on the buffer layer;
a first gate insulating layer on the active layer;
a second conductive layer on the first gate insulating layer;
a first interlayer insulating layer on the second conductive layer; and
a third conductive layer on the first interlayer insulating layer,
wherein source electrodes and drain electrodes of the first transistor, the second transistor, and the driving transistor are formed of the third conductive layer.

9. The display device of claim 8, wherein:
the first voltage line and the second voltage line are formed of the third conductive layer,
the first electrode is directly connected to the source electrode of the driving transistor through a contact hole that penetrates the via layer, and
the second electrode is directly connected to the second voltage line through a contact hole that penetrates the via layer.

10. The display device of claim 2, further comprising:
the first connecting electrode on, and in contact with, the first electrode and first end portions of the light-emitting elements; and
the second connecting electrode on, and in contact with, the second electrode and second end portions of the light-emitting elements.

11. The display device of claim 10, further comprising:
a first insulating layer covering the first electrode and the second electrode; and
a second insulating layer around portions of outer surfaces of each of the light-emitting elements,
wherein at least a portion of the first connecting electrode and a portion of the second connecting electrode are on the second insulating layer.

12. The display device of claim 1, wherein the first transistor and the second transistor are not directly connected to a same node.

13. The display device of claim 1, further comprising:
an insulating layer disposed on the second connecting electrode,
wherein the insulating layer comprises a first surface facing the first substrate and a second surface opposite to the first surface,
wherein the second connecting electrode directly contacts the first surface of the insulating layer, and
wherein the first connecting electrode directly contacts the second surface of the insulating layer.

* * * * *

UNITED STATES PATENT AND TRADEMARK OFFICE
CERTIFICATE OF CORRECTION

| | | |
|---|---|---|
| PATENT NO. | : 12,341,139 B2 | Page 1 of 1 |
| APPLICATION NO. | : 17/454026 | |
| DATED | : June 24, 2025 | |
| INVENTOR(S) | : Ki Yeup Lee et al. | |

It is certified that error appears in the above-identified patent and that said Letters Patent is hereby corrected as shown below:

On the Title Page

In Item (72), in Column 1, under "Inventors", Line 2, delete "Anyang-si" and insert -- Asan-si --.

In Item (72), in Column 1, under "Inventors", Line 3, delete "Anyang-si" and insert -- Asan-si --.

Signed and Sealed this
Thirtieth Day of December, 2025

John A. Squires
*Director of the United States Patent and Trademark Office*